(12) United States Patent
Flitsch

(10) Patent No.: US 11,024,527 B2
(45) Date of Patent: Jun. 1, 2021

(54) METHODS AND APPARATUS FOR NOVEL FABRICATORS WITH CLEANSPACE

(71) Applicant: Frederick A. Flitsch, New Windsor, NY (US)

(72) Inventor: Frederick A. Flitsch, New Windsor, NY (US)

( * ) Notice: Subject to any disclaimer, the term of this patent is extended or adjusted under 35 U.S.C. 154(b) by 0 days.

(21) Appl. No.: 16/213,864

(22) Filed: Dec. 7, 2018

(65) Prior Publication Data

US 2019/0109032 A1    Apr. 11, 2019

Related U.S. Application Data

(60) Continuation-in-part of application No. 15/901,654, filed on Feb. 21, 2018, which is a continuation-in-part of application No. 15/754,202, filed as application No. PCT/US2017/049630 on Aug. 31, 2017, now Pat. No. 10,395,064, said application No. 15/901,654 is a continuation-in-part of application No. 15/241,419, filed on Aug. 19, 2016, now Pat. No. 10,651,063, which is a continuation-in-part of application No.
(Continued)

(51) Int. Cl.
| | |
|---|---|
| *H01L 21/67* | (2006.01) |
| *H01L 21/677* | (2006.01) |
| *B65G 65/00* | (2006.01) |
| *G05B 19/418* | (2006.01) |

(52) U.S. Cl.
CPC ...... *H01L 21/67712* (2013.01); *B65G 65/005* (2013.01); *H01L 21/67017* (2013.01); *H01L 21/67178* (2013.01); *H01L 21/67276* (2013.01); *H01L 21/67706* (2013.01); *H01L 21/67727* (2013.01); *H01L 21/67733* (2013.01); *H01L 21/67736* (2013.01); *B65G 2814/0313* (2013.01); *G05B 19/4182* (2013.01)

(58) Field of Classification Search
CPC ......... H01L 21/67712; H01L 21/67017; H01L 21/67178; H01L 21/67276; H01L 21/67706; H01L 21/67727; H01L 21/67733; H01L 21/67736; B65G 65/005; B65G 2814/0313; G05B 19/4182
USPC ...................................................... 700/112
See application file for complete search history.

(56) References Cited

U.S. PATENT DOCUMENTS

| | | |
|---|---|---|
| 3,158,457 A | 11/1964 | Whitfield |
| 3,588,176 A | 6/1971 | Byrne |
| | (Continued) | |

FOREIGN PATENT DOCUMENTS

| | | | |
|---|---|---|---|
| WO | 2004109748 A2 | 12/2004 | |

*Primary Examiner* — Kenneth M Lo
*Assistant Examiner* — Michael W Choi

(57) ABSTRACT

The present disclosure provides various apparatus and methods for novel cleanspace fabricator designs. In some examples, a cleanspace fabricator may be comprised of vertically stacked tools wherein the product and the processing tools are conveyed through the cleanspace. The fabricator may comprise a processor performing cognitive computing algorithms. In some examples, the processor may be located at a remote location and communication with the cleanspace fabricator. Product may be comprised of or processed upon substrates in some examples. In other examples product may be comprised of materials contained within vessels. In some examples the product within vessels may be in liquid or powder form.

12 Claims, 27 Drawing Sheets

304

Related U.S. Application Data

14/988,735, filed on Jan. 5, 2016, now Pat. No. 10,627,809, which is a continuation of application No. 14/703,552, filed on May 4, 2015, now Pat. No. 9,263,309, which is a continuation-in-part of application No. 14/134,705, filed on Dec. 19, 2013, now Pat. No. 9,159,592, which is a continuation-in-part of application No. 14/024,335, filed on Sep. 11, 2013, now Pat. No. 9,793,146, which is a division of application No. 11/933,280, filed on Oct. 31, 2007, now Pat. No. 8,641,824, which is a division of application No. 11/156,205, filed on Jun. 18, 2005, now Pat. No. 7,513,822, said application No. 14/134,705 is a continuation-in-part of application No. 11/502,689, filed on Aug. 12, 2006, now Pat. No. 9,339,900, said application No. 14/988,735 is a continuation-in-part of application No. 14/689,980, filed on Apr. 17, 2015, now abandoned, which is a continuation-in-part of application No. 13/398,371, filed on Feb. 16, 2012, now Pat. No. 9,059,227, which is a continuation-in-part of application No. 12/691,623, filed on Jan. 21, 2010, now Pat. No. 9,457,442, said application No. 13/398,371 is a continuation-in-part of application No. 11/980,850, filed on Oct. 31, 2007, now abandoned, and a continuation of application No. 11/520,975, filed on Sep. 14, 2006, now Pat. No. 8,229,585, and a continuation of application No. 11/502,689, filed on Aug. 12, 2006, now Pat. No. 9,339,900, said application No. 14/988,735 is a continuation-in-part of application No. 13/747,091, filed on Jan. 22, 2013, now abandoned, said application No. 15/241,419 is a continuation-in-part of application No. 13/829,212, filed on Mar. 14, 2013, now abandoned, which is a continuation-in-part of application No. 13/734,963, filed on Jan. 5, 2013, now abandoned, said application No. 15/901,654 is a continuation-in-part of application No. 13/734,991, filed on Jan. 6, 2013, now abandoned, application No. 16/213,864, which is a continuation-in-part of application No. 14/754,097, filed on Jun. 29, 2015, now abandoned, application No. 16/213,864, which is a continuation-in-part of application No. 15/644,474, filed on Jul. 7, 2017, now abandoned, which is a continuation-in-part of application No. 14/754,097, filed on Jun. 29, 2015, now abandoned, application No. 16/213,864, which is a continuation-in-part of application No. 15/644,474, filed on Jul. 7, 2017, now abandoned, which is a continuation-in-part of application No. 14/542,821, filed on Nov. 17, 2014, now abandoned, said application No. 15/644,474 is a continuation-in-part of application No. 14/663,829, filed on Mar. 20, 2015, now abandoned, application No. 16/213,864, which is a continuation-in-part of application No. 14/852,239, filed on Sep. 11, 2015, now abandoned.

(60) Provisional application No. 61/745,996, filed on Dec. 26, 2012, provisional application No. 60/596,343, filed on Sep. 18, 2005, provisional application No. 60/596,173, filed on Sep. 6, 2005, provisional application No. 60/596,099, filed on Aug. 31, 2005, provisional application No. 60/596,053, filed on Aug. 26, 2005, provisional application No. 60/596,035, filed on Aug. 25, 2005, provisional application No. 60/595,935, filed on Aug. 18, 2005, provisional application No. 61/146,183, filed on Jan. 21, 2009, provisional application No. 61/593,501, filed on Feb. 1, 2012, provisional application No. 61/585,951, filed on Jan. 12, 2012, provisional application No. 62/018,664, filed on Jun. 30, 2014, provisional application No. 61/905,330, filed on Nov. 18, 2013, provisional application No. 61/969,583, filed on Mar. 24, 2014, provisional application No. 62/383,218, filed on Sep. 2, 2016.

(56) References Cited

U.S. PATENT DOCUMENTS

| | | |
|---|---|---|
| 3,603,646 A | 9/1971 | Leoff |
| 3,809,050 A | 5/1974 | Chough et al. |
| 3,812,947 A | 5/1974 | Nygaard |
| 3,930,684 A | 1/1976 | Lasch et al. |
| 3,976,330 A | 8/1976 | Babinski et al. |
| 4,081,201 A | 3/1978 | Hassan et al. |
| 4,165,132 A | 8/1979 | Hassan et al. |
| 4,267,769 A | 5/1981 | Davis et al. |
| 4,278,366 A | 7/1981 | Loveless et al. |
| 4,299,518 A | 11/1981 | Whelan |
| 4,315,705 A | 2/1982 | Flint |
| 4,348,139 A | 9/1982 | Hassan et al. |
| 4,409,889 A | 10/1983 | Burleson |
| 4,501,527 A | 2/1985 | Jacoby et al. |
| 4,554,766 A | 11/1985 | Ziemer et al. |
| 4,608,066 A | 8/1986 | Cadwell |
| 4,612,946 A | 9/1986 | Noh et al. |
| 4,620,353 A | 11/1986 | Pryor |
| 4,649,830 A | 3/1987 | Tanaka |
| 4,667,579 A | 5/1987 | Daw |
| 4,667,580 A | 5/1987 | Wetzel |
| 4,676,144 A | 6/1987 | Smith |
| 4,682,927 A | 7/1987 | Southworth et al. |
| 4,693,175 A | 9/1987 | Hashimoto |
| 4,694,736 A | 9/1987 | Yamagata et al. |
| 4,695,215 A | 9/1987 | Jacoby et al. |
| 4,699,640 A | 10/1987 | Suzuki et al. |
| 4,722,659 A | 2/1988 | Hoyt et al. |
| 4,804,392 A | 2/1989 | Spengler |
| 4,826,360 A | 5/1989 | Iwasawa et al. |
| 4,840,530 A | 6/1989 | Nguyen |
| 4,851,018 A | 7/1989 | Lazzari et al. |
| 4,861,222 A | 8/1989 | Mirkovich |
| 4,867,629 A | 9/1989 | Iwasawa et al. |
| 4,875,825 A | 10/1989 | Tullis et al. |
| 4,923,352 A | 5/1990 | Tamura et al. |
| 4,963,069 A | 10/1990 | Wurst et al. |
| 4,964,776 A | 10/1990 | Wakita et al. |
| 5,029,518 A | 7/1991 | Austin |
| 5,058,491 A | 10/1991 | Wiemer et al. |
| 5,096,477 A | 3/1992 | Shinoda et al. |
| 5,108,513 A | 4/1992 | Muller et al. |
| 5,133,561 A | 7/1992 | Hattori et al. |
| 5,139,459 A | 8/1992 | Takahashi et al. |
| 5,145,303 A | 9/1992 | Clarke |
| 5,167,575 A | 12/1992 | MacDonald |
| 5,217,273 A | 6/1993 | Hendricsen et al. |
| 5,217,559 A * | 6/1993 | Moslehi ............... H01L 21/2686 118/722 |
| 5,219,464 A | 6/1993 | Yamaga et al. |
| 5,256,105 A | 10/1993 | Austin |
| 5,259,812 A | 11/1993 | Kleinsek |
| 5,326,316 A | 7/1994 | Hashimoto et al. |
| 5,344,365 A | 9/1994 | Scott et al. |
| 5,346,518 A * | 9/1994 | Baseman ................ B65G 1/00 206/204 |
| 5,358,420 A | 10/1994 | Cairns et al. |
| 5,385,505 A | 1/1995 | Sharp et al. |
| 5,425,793 A | 6/1995 | Mori et al. |
| 5,451,131 A | 9/1995 | Hecht et al. |
| 5,513,946 A | 5/1996 | Sawada et al. |
| 5,518,451 A | 5/1996 | Renz et al. |
| 5,562,539 A | 10/1996 | Hashimoto et al. |

(56) References Cited

U.S. PATENT DOCUMENTS

| | | |
|---|---|---|
| 5,570,990 A | 11/1996 | Bonora et al. |
| 5,641,354 A | 6/1997 | Sakauchi et al. |
| 5,779,799 A | 7/1998 | Davis |
| 5,795,356 A | 8/1998 | Leveen |
| 5,827,118 A | 10/1998 | Johnson et al. |
| 5,848,933 A | 12/1998 | Roberson et al. |
| 5,860,258 A | 1/1999 | Faith et al. |
| 5,863,246 A | 1/1999 | Bujak |
| 6,040,235 A | 3/2000 | Badehi |
| 6,047,068 A | 4/2000 | Rhelimi et al. |
| 6,082,949 A | 7/2000 | Rosenquist |
| 6,091,498 A | 7/2000 | Hanson et al. |
| 6,099,599 A | 8/2000 | Wu |
| 6,138,721 A | 10/2000 | Bonora et al. |
| 6,183,358 B1 | 2/2001 | Adair |
| 6,186,723 B1 | 2/2001 | Murata et al. |
| 6,220,808 B1 | 4/2001 | Bonora et al. |
| 6,221,160 B1 | 4/2001 | Lin |
| 6,238,283 B1 | 5/2001 | Matsuyama et al. |
| 6,267,131 B1 | 7/2001 | Masada et al. |
| 6,306,189 B1 | 10/2001 | Renz |
| 6,312,525 B1 | 11/2001 | Bright et al. |
| 6,322,597 B1 | 11/2001 | Ohta |
| 6,328,768 B1 | 12/2001 | Ohta |
| 6,338,371 B1 | 1/2002 | Araki et al. |
| 6,382,895 B1 | 5/2002 | Konishi et al. |
| 6,431,948 B1 | 8/2002 | Atoh |
| 6,468,021 B1 | 10/2002 | Bonora et al. |
| 6,574,937 B1 | 6/2003 | Rapisarda et al. |
| 6,582,178 B2 | 6/2003 | Petruccelli |
| 6,591,162 B1 | 7/2003 | Martin |
| 6,598,279 B1 | 7/2003 | Morgan |
| 6,612,084 B2 | 9/2003 | Rapisarda et al. |
| 6,654,122 B1 | 11/2003 | Hanson et al. |
| 6,672,820 B1 | 1/2004 | Hanson et al. |
| 6,677,690 B2 | 1/2004 | Fosnight et al. |
| 6,694,759 B1 | 2/2004 | Bash et al. |
| 6,698,991 B1 | 3/2004 | Bachrach et al. |
| 6,736,582 B1 | 5/2004 | Mages et al. |
| 6,755,221 B2 | 6/2004 | Jeong et al. |
| 6,776,850 B2 | 8/2004 | Liao et al. |
| 6,854,583 B1 | 2/2005 | Horn |
| 6,869,457 B2 | 3/2005 | Nakagawa |
| 6,875,282 B2 | 4/2005 | Tanaka et al. |
| 6,902,762 B2 | 6/2005 | Miyata |
| 6,955,595 B2 | 10/2005 | Kim |
| 7,008,124 B2 | 3/2006 | Miyata |
| 7,014,672 B2 | 3/2006 | Ishihara et al. |
| 7,039,999 B2 | 5/2006 | Tarr et al. |
| 7,077,173 B2 | 7/2006 | Tokunaga |
| 7,083,515 B2 | 8/2006 | Rapisarda et al. |
| 7,216,497 B2 | 5/2007 | Hull et al. |
| 7,257,458 B1 | 8/2007 | Markle |
| 7,269,925 B2 | 9/2007 | Lam |
| 7,513,822 B2 | 4/2009 | Flitsch |
| 7,604,449 B1* | 10/2009 | Kaveh ............... H01L 21/67201 414/411 |
| 7,669,777 B2 | 3/2010 | Hull et al. |
| 8,029,225 B2 | 10/2011 | Meulen |
| 8,163,631 B2 | 4/2012 | Chiang et al. |
| 8,197,177 B2 | 6/2012 | Meulen et al. |
| 8,434,989 B2 | 5/2013 | Meulen |
| 8,483,883 B1 | 7/2013 | Watson |
| 8,584,349 B2 | 11/2013 | Scannon et al. |
| 8,596,312 B2 | 12/2013 | Natsume et al. |
| 8,753,063 B2 | 6/2014 | Rebstock |
| 8,789,269 B2 | 7/2014 | Kilibarda et al. |
| 2001/0033012 A1 | 10/2001 | Koemmerling et al. |
| 2002/0020751 A1 | 2/2002 | Matsumoto |
| 2002/0025244 A1 | 2/2002 | Kim |
| 2002/0030113 A1 | 3/2002 | Abuzeid et al. |
| 2002/0051564 A1 | 5/2002 | Benesch et al. |
| 2002/0088543 A1 | 7/2002 | Ashjaee et al. |
| 2002/0129707 A1 | 9/2002 | Tanaka et al. |
| 2002/0143656 A1 | 10/2002 | Matsuo et al. |
| 2002/0171449 A1 | 11/2002 | Shimizu et al. |
| 2002/0176936 A1 | 11/2002 | Matsuyama |
| 2002/0197136 A1 | 12/2002 | Huang et al. |
| 2003/0053894 A1 | 3/2003 | Matsumoto |
| 2003/0062578 A1 | 4/2003 | Dougan et al. |
| 2003/0082030 A1 | 5/2003 | Puerto et al. |
| 2003/0091410 A1 | 5/2003 | Larson et al. |
| 2003/0101938 A1 | 6/2003 | Ronsse et al. |
| 2003/0118476 A1 | 6/2003 | Fujii et al. |
| 2003/0181040 A1* | 9/2003 | Ivanov ............... C23C 18/1628 438/687 |
| 2003/0198541 A1 | 10/2003 | Davis et al. |
| 2003/0202866 A1 | 10/2003 | Weng et al. |
| 2003/0230031 A1 | 12/2003 | Lam |
| 2004/0006544 A1 | 1/2004 | Gulett |
| 2004/0047714 A1 | 3/2004 | Poli et al. |
| 2004/0062627 A1 | 4/2004 | Aggarwal et al. |
| 2004/0081546 A1 | 4/2004 | Elliott et al. |
| 2004/0094087 A1* | 5/2004 | Ivanov ............... H01L 21/67769 118/300 |
| 2004/0157463 A1 | 8/2004 | Jones |
| 2004/0187451 A1 | 9/2004 | Suzuki et al. |
| 2004/0207836 A1 | 10/2004 | Chhibber et al. |
| 2004/0225462 A1 | 11/2004 | Renken et al. |
| 2004/0226510 A1 | 11/2004 | Hanson et al. |
| 2004/0250762 A1 | 12/2004 | Shigetomi et al. |
| 2005/0005957 A1 | 1/2005 | Yamagata et al. |
| 2005/0014370 A1 | 1/2005 | Jones |
| 2005/0120578 A1 | 6/2005 | Meulen |
| 2006/0156978 A1 | 7/2006 | Lipson et al. |
| 2006/0213842 A1 | 9/2006 | Shani et al. |
| 2007/0046284 A1 | 3/2007 | Renken et al. |
| 2007/0053188 A1 | 3/2007 | New et al. |
| 2007/0069087 A1 | 3/2007 | Mumm |
| 2007/0110842 A1 | 5/2007 | Kalemba |
| 2008/0089765 A1 | 4/2008 | Moriya et al. |
| 2008/0116105 A1 | 5/2008 | Statham |
| 2008/0134076 A1* | 6/2008 | Pannese ............... G05B 17/02 715/772 |
| 2009/0326703 A1 | 12/2009 | Presley et al. |
| 2011/0245964 A1 | 10/2011 | Sullivan et al. |
| 2012/0109866 A1* | 5/2012 | Modha ............... G06N 3/063 706/28 |
| 2012/0235579 A1 | 9/2012 | Chemel et al. |
| 2015/0227136 A1 | 8/2015 | Flitsch |

* cited by examiner

302

304

301

303

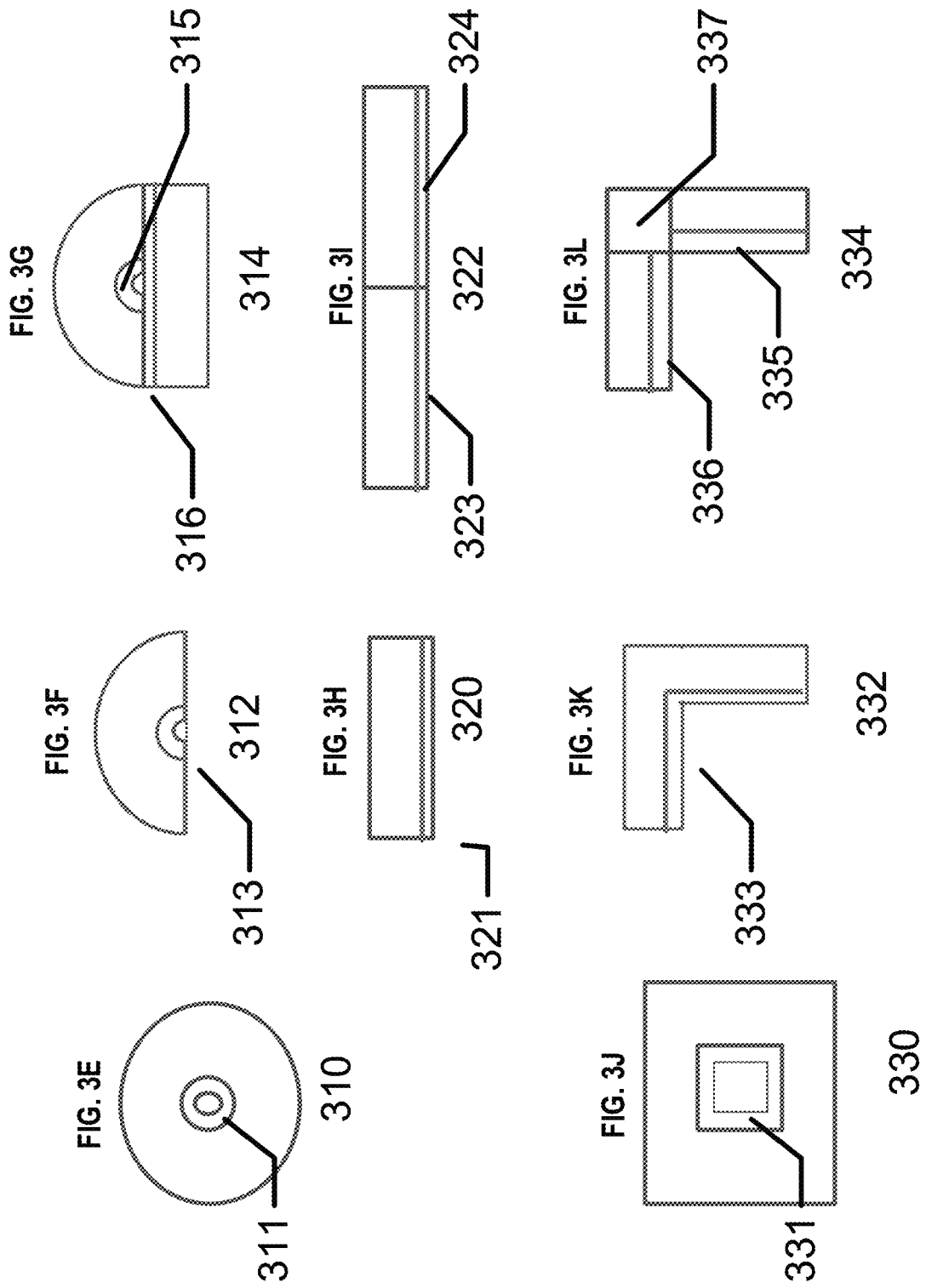

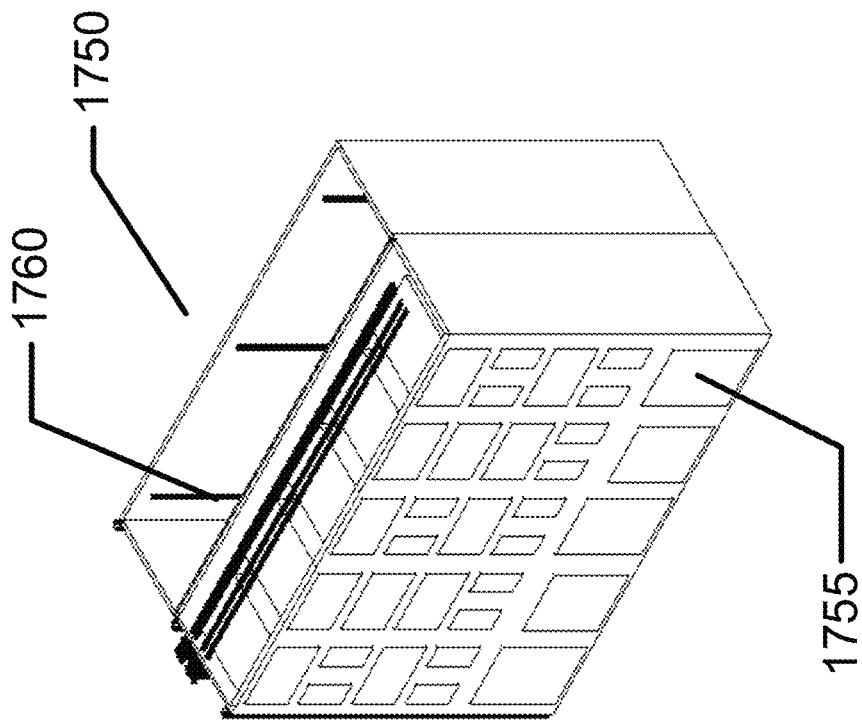
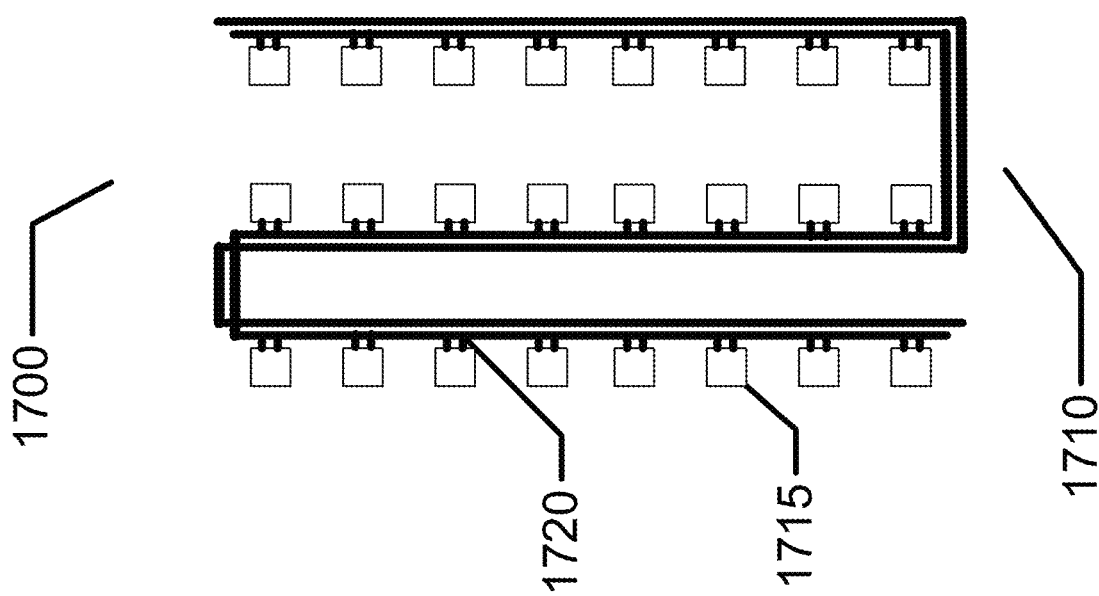
FIG. 17

METHODS AND APPARATUS FOR NOVEL FABRICATORS WITH CLEANSPACE

CROSS REFERENCE TO RELATED APPLICATIONS

The present application claims priority to patent application Ser. No. 15/901,654, filed Feb. 21, 2018 entitled "CUSTOMIZED SMART DEVICES AND TOUCHSCREEN DEVICES AND CLEANSPACE MANUFACTURING METHODS TO MAKE THEM TRACKING" as a Continuation in Part Application. The U.S. patent application Ser. No. 15/901,654, is also a continuation-in-part of the U.S. patent application Ser. No. 15/754,202, filed Feb. 21, 2018 and entitled "CUSTOMIZED SMART DEVICES AND TOUCHSCREEN DEVICES AND CLEANSPACE MANUFACTURING METHODS TO MAKE THEM" and also claims priority to Ser. No. 15/241,419 filed Jan. 5, 2016 entitled "METHODS OF PROTOTYPING AND MANUFACTURING WITH CLEANSPACE FABRICATORS." The U.S. patent application Ser. No. 15/754,202, in turn claims the benefit of the U.S. Provisional Patent Applications bearing the Ser. No. 62/383,218, filed Sep. 2, 2016 and entitled "CUSTOMIZED SMART DEVICES AND TOUCHSCREEN DEVICES AND CLEANSPACE MANUFACTURING METHODS TO MAKE THEM" The U.S. patent application Ser. No. 15/241,419, in turn claims priority to the U.S. Provisional patent applications bearing the Ser. No. 14/988,735, filed Jan. 5, 2016 and entitled "Multilevel Fabricators." The U.S. patent application Ser. No. 14/988,735, in turn claims priority to the U.S. Provisional patent application bearing the Ser. No. 14/703,552, filed May 4, 2015 entitled "METHOD AND APPARATUS FOR AN AUTOMATED TOOL HANDLING SYSTEM FOR A MULTILEVEL CLEANSPACE FABRICATOR" now U.S. Pat. No. 9,263,309 issued Feb. 16, 2016. This application claims priority to the U.S. patent application Ser. No. 14/754,097 as a continuation in part filed Jun. 29 2015 which in turn claims the benefit of the U.S. Provisional Patent Applications bearing the Ser. No. 62/018,664, filed Jun. 30, 2014 and entitled METHODS AND APPARATUS FOR NOVEL CLEANSPACE FABRICATORS. This application also claims priority to the U.S. patent application Ser. No. 11/502,689, filed Aug. 12, 2006 and entitled: "Method and Apparatus to support a Cleanspace Fabricator" as a continuation in part application. The U.S. patent application Ser. No. 11/502,689 in turn claims priority to the following Provisional Applications: Provisional Application Ser. No. 60/596,343, filed Sep. 18, 2005 and entitled: "Specialized Methods for Substrate Processing for a Clean Space Where Processing Tools are Vertically Oriented"; and also Provisional Application, Ser. No. 60/596,173, filed Sep. 6, 2005 and entitled: "Method and Apparatus for Substrate Handling for a Clean Space Where Processing Tools are Reversibly Removable"; and also Provisional Application, Ser. No. 60/596,099, filed Aug. 31, 2005 and entitled: "Method and Apparatus for a Single Substrate Carrier For Semiconductor Processing"; and also Provisional Application, Ser. No. 60/596,053 filed Aug. 26, 2005 and entitled: "Method and Apparatus for an Elevator System for Tooling and Personnel for a Multilevel Cleanspace/Fabricator"; and also Provisional Application, Ser. No. 60/596,035 filed Aug. 25, 2005 and entitled: "Method and Apparatus for a Tool Chassis Support System for Simplified, Integrated and Reversible Installation of Process Tooling"; and also Provisional Application, Ser. No. 60/595,935 filed Aug. 18, 2005, and entitled: "Method and Apparatus for the Integrated, Flexible and Easily Reversible Connection of Utilities, Chemicals and Gasses to Process Tooling." This application also claims priority to the U.S. patent application Ser. No. 14/024,335, filed Sep. 11, 2013 and entitled "Method and Apparatus for a Cleanspace Fabricator" as a continuation in part application. The U.S. patent application Ser. No. 14/024,335 in turn claims priority to the U.S. patent application Ser. No. 11/933,280, filed Oct. 31, 2007 and entitled "Method and Apparatus for a Cleanspace Fabricator" now U.S. Pat. No. 8,641,824. The U.S. patent application Ser. No. 11/933,280 in turn claims priority to the U.S. patent application Ser. No. 11/156,205, filed Jun. 18, 2005 and entitled "Method and Apparatus for a Cleanspace Fabricator" now U.S. Pat. No. 7,513,822. The present application claims priority to the U.S. patent application Ser. No. 15/644,474 as a continuation in part which was filed Jul. 7, 2017 which in turn claims priority to the U.S. patent application Ser. No. 14/663,829 as a continuation in part application which was filed Mar. 3, 2015, which in turn claims the benefit of U.S. Provisional Application 61/969,583 filed Mar. 24, 2014. The U.S. patent application Ser. No. 15/644,474 also claims priority to the U.S. patent application Ser. No. 14/542,821 as a continuation in part filed Nov. 17, 2014 which in turn claims the benefit of the U.S. Provisional Application Ser. No. 61/905, 330. The contents of all the heretofore cross-referenced matters are relied upon and hereby incorporated by reference. The contents of any cross reference matters in the application data sheet of the present application are also hereby incorporated by reference.

FIELD OF THE INVENTION

The present invention relates to methods and associated apparatus s which relate to cleanspace fabricators. Novel designs may be formed of different architecture from current models. In addition, novel fabricators may be formed by the combination of cleanspace fabricators and cleanroom fabricators.

BACKGROUND OF THE INVENTION

A known approach to advanced technology fabrication of materials such as semiconductor substrates is to assemble a manufacturing facility as a "cleanroom." In such cleanrooms, processing tools are arranged to provide aisle space for human operators or automation equipment. Exemplary cleanroom design is described in: "Cleanroom Design, Second Edition," edited by W. Whyte, published by John Wiley & Sons, 1999, ISBN 0-471-94204-9, (herein after referred to as "the Whyte text" and the content of which is included for reference in its entirety).

Cleanroom design has evolved over time to include locating processing stations within clean hoods. Vertical unidirectional airflow can be directed through a raised floor, with separate cores for the tools and aisles. It is also known to have specialized mini-environments which surround only a processing tool for added space cleanliness. Another known approach includes the "ballroom" approach, wherein tools, operators and automation all reside in the same cleanroom.

Evolutionary improvements have enabled higher yields and the production of devices with smaller geometries. However, known cleanroom design has disadvantages and limitations.

For example, as the size of tools has increased and the dimensions of cleanrooms have increased, the volume of cleanspace that is controlled has concomitantly increased.

As a result, the cost of building the cleanspace, and the cost of maintaining the cleanliness of such cleanspace, has increased considerably.

Tool installation in a cleanroom can be difficult. The initial "fit up" of a "fab" with tools, when the floor space is relatively empty, can be relatively straightforward. However, as tools are put in place and a fabricator begins to process substrates, it can become increasingly difficult and disruptive of job flow, to either place new tools or remove old ones. Likewise it has been difficult to remove a subassembly or component that makes up a fabricator tool in order to perform maintenance or replace such a subassembly or component of the fabricator tool. It would be desirable therefore to reduce installation difficulties attendant to dense tool placement while still maintaining such density, since denser tool placement otherwise affords substantial economic advantages relating to cleanroom construction and maintenance.

It may be desirable to leverage the advantages of cleanspace design with new fabricator designs.

SUMMARY OF THE INVENTION

Accordingly, the present invention provides novel designs that leverage the advantages of cleanspace design in new designs where peripheral tool access and wafer transport are performed on the same side of the vertically deployed tools. It may also be desirable to leverage the benefits of cleanspace fabricators by combining elements of such fabricators with classic cleanroom designs for a subset of the fabricator.

In some, processing tool bodies, which may perform processes on substrates, liquids or powders, can be removed and replaced with much greater ease than is the standard case. The design also anticipates the automated transfer of substrates and vessels inside a clean space from a tool port of one tool to another. The substrates can reside inside specialized carriers designed to carry ones substrate at a time. Whereas, in some embodiments vessels may themselves contain the product and act as a carrier.

Further design enhancements can entail the use of automated equipment to carry and support the tool body movement into and out of the fab environment. In this invention, numerous methods of using some or all of these innovations in designing, operating or otherwise interacting with such fabricator environments are described. In some examples, the automation used to move the tool bodies may themselves reside in the cleanspace region along with automation used to move substrates from tool port to tool port. In some designs the tool bodies may be placed into position such that tool ports are on a side closest to the tool automation.

The present invention can therefore include methods and apparatus for situating processing tools in a vertical dimension and control software modules for making such tools functional both within the cleanspace type entity itself and also in networks of such fabricators.

In some embodiments of the invention, methods are provided which utilize at least one fabricator where the cleanspace type region is vertically deployed. As previously mentioned in some embodiments the cleanspace type region may define a design type regardless of the cleanliness within the cleanspace type region. Within said fabricator there will be at least one and typically more tool chassis and toolPods. A toolPod will typically be attached to a tool chassis directly or indirectly thorough one or more other piece or pieces of equipment which attach to the toolPod. At least the one fabricator will perform a process in one of the toolPods and typically will perform a process flow which will be performed in at least one toolPod. The toolPod may have an attached or integral Toolport that is useful for the transport of substrates from one tool or toolPod to another tool or toolPod. In these embodiments, a unique aspect of the embodiments is that the first toolPod may be removed from the fabricator or factory for a maintenance activity or repair and then replaced with another toolPod. The use of the tool chassis together with a toolPod may result in a replacement that takes less than a day to perform. In some cases the replacement may take less than an hour. There may be numerous reasons for the replacement. It may be to repair the first toolPod or it may be replace the toolPod with another toolPod where the tool within is of a different or newer design type. These methods may be additionally useful to produce a product when the substrate produced by the process flow may next be processed with additional steps including those which dice or cut or segment the substrate into subsections which may be called chips. In some other embodiments the methods may be additionally useful to a product that may be contained in a vessel. The products contained in a vessel may include in a non-limiting sense powders, emulsions, suspensions and liquids.

In other embodiments of the invention, the fabricator described above and the methods described above may be repeated to occur in a multiple of fabricators. These combinations of fabricators may form a network of fabricators. The network of fabricators may have means of communication amongst and between the various fabricators. A method may involve a customer distributing a need for a part utilizing communication systems that interact with the individual fabricators. The communication of need for the part may be received in various fashions by the fabricator or affiliated users of the fabricators. The fabricator or user of the fabricator may assess the ability to provide a product meeting the need communicated and then utilize one or more of the networked fabricators to produce the product. In the process of designing such a part or more globally any part, the designing entity may elect to use intellectual property of others to form their product wherein said intellectual property has been duly offered for use either by free public domain type use or licensed use. The network or individual fabs may receive payments for the production of a product and may facilitate the payment of royalty payments to intellectual property holders as appropriate.

In some embodiments, the methods of producing products in the mentioned cleanspace fabricator types may be utilized to define new entities for large scale manufacturing. By combining large numbers of small volume processing tools the fabricators may produce large amounts of product. In a unique manner, the tools may be further developed to simplify operations and thus lower cost. Some tools may not be at a design stage to be consistent with a tool pod, tool chassis formalism; and therefore may also function efficiently in a clean room environment. Hybrid combinations of cleanspace fabricators with cleanroom fabricator portions may define novel fabricators according to the present disclosure.

In some embodiments, the methods of utilizing cleanspace fabricators that have been discussed involve the removal of a toolPod from a fabricator or factory, or in the case of a hybrid fabricator from the portion of the hybrid fabricator that comprises cleanspace fabricator design with cleanrooms. After such removal, in some embodiments the toolPod may be disposed of. In other embodiments, the toolPod may be recycled. In still other embodiments the toolPod may be sent to a maintenance facility. The maintenance facility may be located within the confines of the business entity which removed the toolPod or alternatively in a remote maintenance facility. If the maintenance will be prepared in a remote facility the toolPod may be shipped by various means including land transportation of automobiles, trucks, or trains or similar conveyances or by water transportation including ships for example or by air transportation means. In some embodiments, once the toolPod reaches a maintenance facility it may be transported to a location within a cleanspace or a cleanroom where maintenance activity may be performed. In the performance of the maintenance activity the toolPod may be disassembled at least in part to allow for access of maintenance personnel or equipment to components within the toolPod. Alternatively automated diagnostic equipment may perform tests and perform maintenance without a disassembly step in some cases. After the toolPod is maintained it may be reassembled as necessary and then tested. It may be tested on a test stand or placed upon a tool chassis. The tests may involve functional tests of the components or involve tests upon substrates which are monitors or substrates representative of product. The toolPod may thereafter be shipped to the same location it came from or another different location. At the same location, if shipped there it may be placed at a later time on the same Tool Chassis it was mated with previously or alternatively it may be placed on a different Tool Chassis.

One general aspect includes a method for processing a product; the method includes obtaining a fabricator including at least a first vertically deployed cleanspace, at least a first tool chassis and at least a first toolpod attached to the first tool chassis. The method may further include processing a first product in the first toolpod; and handling a first product at a toolport of the first toolpod within the first vertically deployed cleanspace. Other embodiments of this aspect include corresponding computer systems, apparatus, and computer programs recorded on one or more computer storage devices, each configured to perform the actions of the methods.

Implementations may include one or more of the following features. The method for processing a product where a vertically deployed cleanspace is a portion of a hybrid fabricator. There may be examples of this method where the product includes a substrate. There may also be examples of this method where the product includes a vessel. In some examples, there may be methods for processing a product where a vertically deployed cleanspace is utilized for moving product from the toolport of a first toolpod and where the same vertically deployed cleanspace is utilized for moving at least the first toolpod from the first tool chassis. There may be versions of these methods where the product includes a substrate. There may also be versions of these methods where the product includes a vessel.

Designs for fabricators based on principles described in the present disclosure may also include fabricators where the product includes a substrate. Some of these define fabricators where the substrate is a wafer, and in some examples the wafer includes a semiconductor. Other examples may include fabricators where the product includes a material in a vessel. In some of these examples, the fabricator design may afford processing where the product is a pharmaceutical. Implementations of the described techniques may include hardware, a method or process, or computer software on a computer-accessible medium.

One general aspect includes a fabricator for processing a product including: a first tool chassis; a first toolpod, where the first toolpod is connected to the first tool chassis, where through the first tool chassis the first toolpod is connected to at least a first utility service of the fabricator; a second tool chassis; where the second tool chassis is located within the fabricator such that at least a portion of the second tool chassis is located in a first plane that is vertically above a second plane containing at least a first portion of the first tool chassis; a vertically deployed cleanspace; where a first toolport on the first toolpod is located at least partially within the vertically deployed cleanspace, where a removal of the first toolpod conveys the first toolpod through the cleanspace; a first automated handling device to move the product from the first toolport, where the first automated handling device is located within the cleanspace; and a second automated handling device to convey at least the first toolpod, where the first toolpod is conveyed through the portion including the cleanspace. Other embodiments of this aspect include corresponding computer systems, apparatus, and computer programs recorded on one or more computer storage devices, each configured to perform the actions of the methods.

Implementations may include one or more of the following features. The fabricator where the product includes a substrate. The fabricator where the substrate is a wafer. The fabricator where the wafer is comprised of semiconductor. The fabricator where the product includes a material in a vessel. The fabricator where the product is a pharmaceutical.

One general aspect includes a fabricator for processing a product including: a first tool chassis; a first toolpod, where the first toolpod is connected to the first tool chassis, where through the first tool chassis the first toolpod is connected to at least a first utility service of the fabricator; a second tool chassis; where the second tool chassis is located within the fabricator such that at least a portion of the second tool chassis is located in a first plane that is vertically above a second plane containing at least a first portion of the first tool chassis; a vertically deployed cleanspace; where a first toolport on the first toolpod is located at least partially within the vertically deployed cleanspace, where a removal of the first toolpod conveys the first toolpod through the cleanspace; a first automated handling device to move product from the first toolport, where the first automated handling device is located within the cleanspace; a horizontally deployed clean room; where at least a first cleanroom processing tool is deployed upon a floor in the clean room; and an apparatus which interfaces with a dividing region between the cleanspace and the cleanroom, where the product may be transferred between the cleanspace and the cleanroom. Other embodiments of this aspect include corresponding computer systems, apparatus, and computer programs recorded on one or more computer storage devices, each configured to perform the actions of the methods.

Implementations of the previous general aspect may include one or more of the following features. The fabricator where the product includes a substrate. The fabricator where the substrate is a wafer. The fabricator where the wafer is comprised of semiconductor. The fabricator where the product includes a material in a vessel. The fabricator where the product includes a pharmaceutical. Implementations of the described techniques may include hardware, a method or process, or computer software on a computer-accessible medium. Accordingly, there are novel methods to define cleanspace fabricators that incorporate elements from existing manufacturing lines. In some embodiments a cleanspace fabricator may be assembled with locations for process tools and a primary cleanspace location in which automation is found to move production units from tool to tool. Into the cleanspace, tools along with their existing automation components may be moved into the cleanspace fabricator and operated. In some embodiments a multilevel cleanspace fabricator may be formed and then when tools and automation are used from an existing fabricator there may also be installed automation that can move the production units from one level to a next level. The production units may be numerous types of elements of a production process that are acted on by processing tools to produce products; sometimes these units are substrates of various shapes and sizes which may be contained in carriers of various types.

In other embodiments, only the existing process tools may be added to the cleanspace manufacturing and new automation may be designed and installed. The new automation may be of a custom design or a straight forward design of standard cleanspace manufacturing types. Production units may be processed by various methods within the retrofitted manufacturing line as the production units are moved from process tool to process tool.

In still further embodiments the process tools as well as the automation may be redesigned and then installed into the cleanspace fabricator. The processes may be similar or identical to those that are run in the existing manufacturing lines and tools. The types of production units that are moved from tool to tool can be of the similar diversity discussed above, and may also be contained in carriers of different types while moving from tool to tool. In certain embodiments of this type, the redesigned process tool may be made of a size and form factor that it may be placed in a tool pod and tool carrier type of design which leverages advantages of the cleanspace fabricator type. Since the tools are nearly all or are all located on the periphery of the cleanspace, reversible removability of the tooling is made advantageous. In still further subsets of these embodiment types, the redesigned tooling may be made smaller, may process less production units per hour because of that but may consolidate some or all of the processing steps from the existing manufacturing line into a single entity. By installing many of these redesigned units into a cleanspace fabricator, the output of the fabricator may equal or exceed that of the original manufacturing line while improving the contamination and particulate aspects all with various efficiencies afforded by the cleanspace fabricator, tool pod and tool chassis novelties.

In some embodiments, the manufacturing line may need to have both particulate and biological contamination sources eliminated from the environment. The nature of the cleanspace fabricator and the primary cleanspace together with design aspects for the processing tools and carriers may allow for embodiments that allow for efficient production of various types of production units including in a non-limiting sense biomedical devices, semiconductor devices, Microelectromechanical systems, photonic devices, testing systems and other such production products.

The present invention can therefore include methods and apparatus for retrofitting existing manufacturing lines, for redesigning existing manufacturing tooling and automation systems into a cleanspace fabricator environment and for processing production units in these fabricators.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIGS. 3A-3L—Illustrations of different types of cleanspace type designs that may define fabricators or be replicated within a fabricator.

FIGS. 15, 15A and 15B—Are illustrations of an exemplary view of a substrate comprising a work surface of processing tools, illustrated within an exemplary processing tool and outside the processing tool, where the work surface is moved from tool to tool; and an illustration of a way the substrate work surface may be formed into a carrier.

FIG. 17—Illustrates an exemplary comparison of spatial layouts for some embodiments of classic manufacturing tool layout and of the cleanspace type.

DETAILED DESCRIPTION

A cleanspace fabricator is an alternative design type for high technology manufacturing as compared with classic cleanroom fabricators. In place of a cleanroom, fabricators of this type may be constructed with a cleanspace that contains the substrates or vessels, typically in containers, and the automation to move the substrates and containers or vessels around between ports of tools. As used herein, the common term "tool" is identified as a term to classify processing tools or processing equipment that perform processes or metrology on work product. The cleanspace may typically be much smaller than the space a typical cleanroom may occupy and may also be envisioned as being turned on its side. In some embodiments, the processing tools may be shrunk which changes the processing environment further. The processing tools may be used to process substrates or the contents of vessels.

Figure 1:
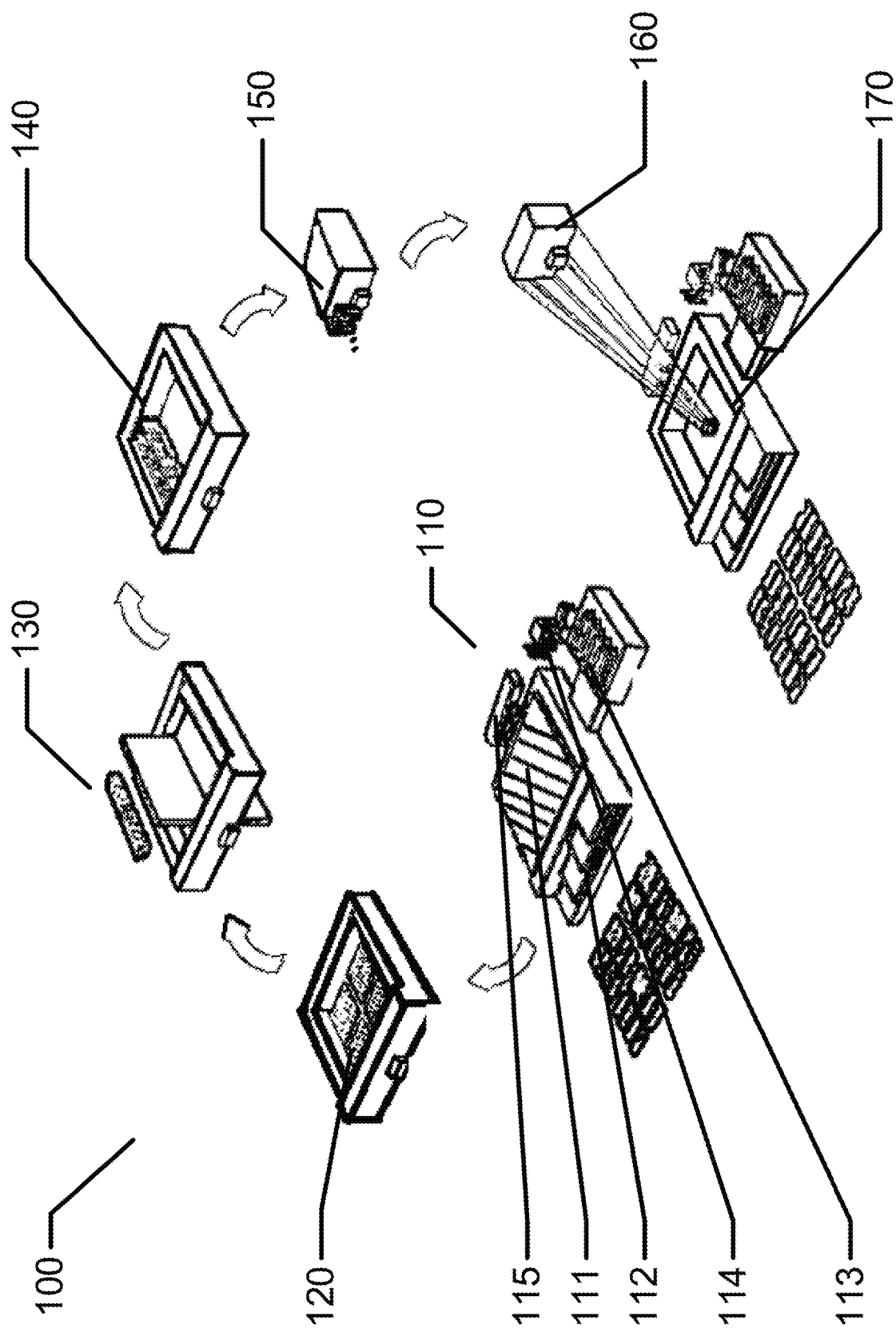
FIG. 1—A depiction of the changes related to cleanspace type designed fabricators and the size differences that are possible from the state of the art.

In FIG. 1, item 100, a depiction of the changes possible with a cleanspace type fabricator compared to a full cleanroom fabricator is described. In Item 110, a typical cleanroom based fabrication site is depicted. Item 111, may represent the cleanroom, item 112 may represent office space for the various functions to support the production, item 113 may represent facilities to control and generate the necessary utilities including clean room air which may be temperature and humidity controlled, item 114 may represent facilities for gasses and chemicals. Item 115 may represent safety and fire control operations.

Continuing on FIG. 1, the advantages of a cleanspace fabricator allow for less capacity needs for the support facilities. Especially when the fabricator is focused in small volumes these facilities may be greatly reduced. The representation of item 120 shows the cleanroom space alone where the tools are now seen through the ceiling of the facility which would be where the cleanroom air filters would typically be located. The size of the cleanroom is still roughly 6 football fields in size. This depiction may represent the reduced site services aspect of cleanspace fabricators.

In some embodiments of a cleanspace fabricator, the cleanroom may be replaced with the cleanspace. Proceeding to item 130 in FIG. 1, a representation of a change in the cleanroom may be depicted. In some embodiments, a cleanspace may be envisioned by the process of rotating a fab's cleanroom on its side. After this, the dimension of the thus rotated cleanroom may then be shrunk by up to a factor of tenfold. The tools are represented as being removed from the cleanroom environment and "hovering" about the facility. This changed cleanspace dimension is one of the reasons for the reduced amount of site service requirements.

Proceeding further, item 140 demonstrates the placement in some embodiments of tooling in a vertical dimension. The tools that were hovering above the facility are now shown as being oriented next to the cleanspace environments in a vertically oriented or stacked orientation. These tool all about both the cleanspace and also a region external to the cleanspace and thus all exist on the periphery. Therefore, item 140 may represent the peripheral tool access aspect of the cleanspace fabricator. What may be apparent is that this type of orientation of the tooling also allows for the further shrinkage of the fabricator dimension required.

In some embodiments, a shrunken version of the fab due only to the orientation of tooling may result even when the same numbers of tools are utilized. However, due to a variety of aspects of the cleanspace fabricator, there may be operational modes that make business sense to organize a minimal number of tools into a cleanspace type facility. Such a reduced number of tools may result in the reduced fab footprint as depicted in item 150. However, still further embodiments of the operational and business models may derive if the tools themselves are reduced in size so that they process wafers that are roughly 2 inches in diameter or at least significantly smaller than standard dimensions. Another point made in the depiction of item 150 shows that the tools may be shrunken to create another version of the cleanspace fabricator.

Item 160 may show the further reduced footprint of a cleanspace fabricator whose purpose in some embodiments may be a focus on activities of small volume. In these type of embodiments, the small tools occupy less space than large tools further reducing the space of the cleanspace and thus the site support aspects of fabricators the extreme of which has been depicted in the figure starting with item 120. If such a prototype fabricator as item 160 is placed within the original footprint item 170 it may be clear the significant scale differences that are possible.

Description of a Linear, Vertical Cleanspace Fabricator

There are a number of types of cleanspace fabricators that may be possible with different orientations. For the purposes of illustration one exemplary type where the fab shape is planar with tools oriented in vertical orientations may be used. This type may result in the depictions shown in FIG. 1. An exemplary representation of what the internal structure of these types of fabs may look like is shown in a partial cross section representation in FIG. 2, item 200. Item 210 may represent the roof of such a fabricator where some of the roof has been removed to allow for a view into the internal structure. Additionally, items 220 may represent the external walls of the facility which are also removed in part to allow a view into external structure.

Figure 2:
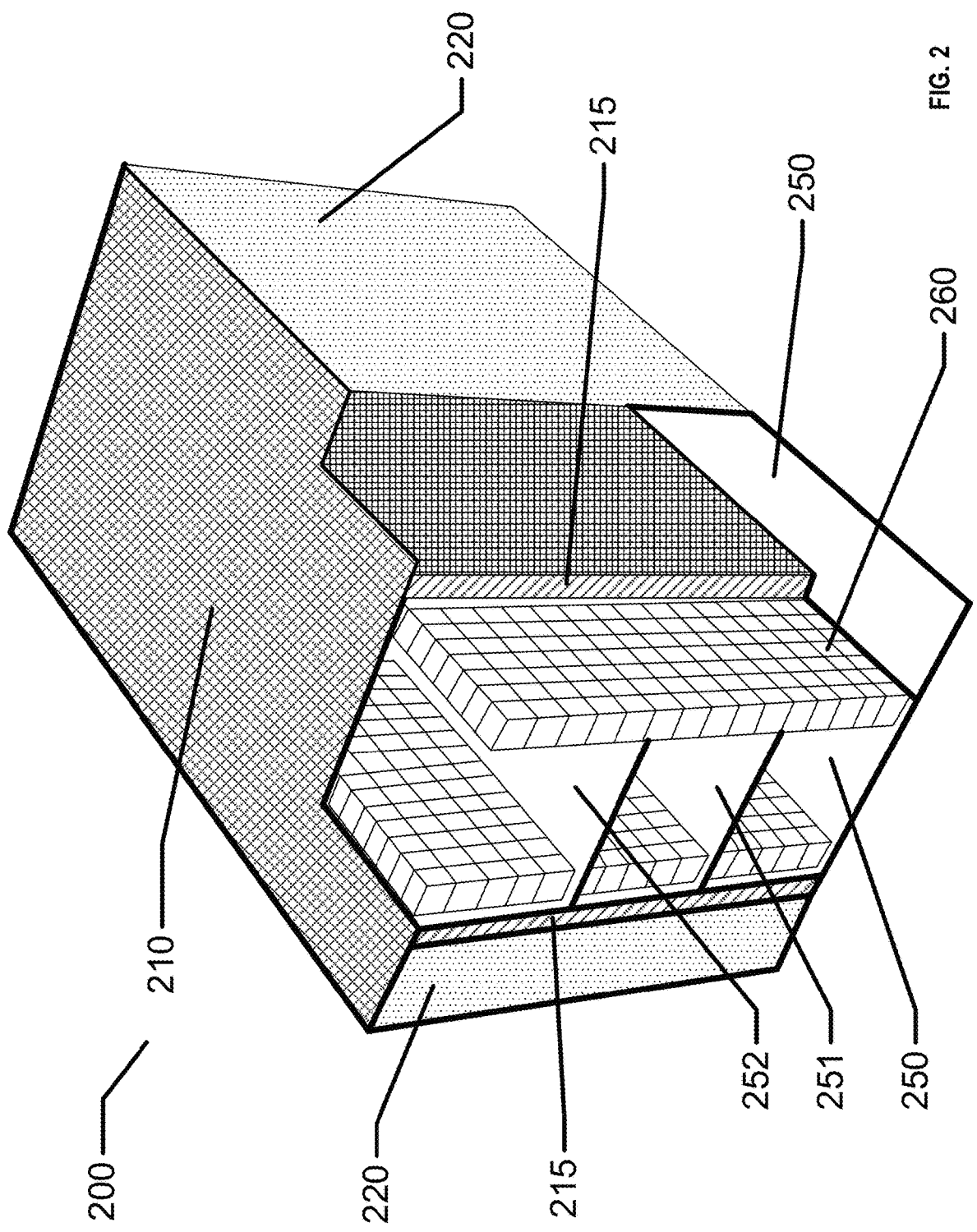
FIG. 2—An illustration of a small tool cleanspace fabricator in a sectional type representation whose primary region of material transport may exist between vertical walls spanning multiple vertical levels.

In the linear and vertical cleanspace fabricator of FIG. 2 there are a number of aspects that may be observed in the representation. The "rotated and shrunken" cleanspace regions may be observed as items 215. The occurrence of item 215 on the right side of the figure is depicted with a portion of its length cut off to show its rough size in cross section. The cleanspaces lie adjacent to the tool pod locations. Depicted as item 260, the small cubical features represent tooling locations within the fabricator. These locations are located vertically and are adjacent to the cleanspace regions. In some embodiments a portion of the tool, the tool port, may protrude into the cleanspace region to interact with the automation that may reside in this region.

Items 250 may represent the fabricator floor or ground level. On the right side, portions of the fabricator support structure may be removed so that the section may be demonstrated. In between the tools and the cleanspace regions, the location of the item 250 may be a floor and may represent the region where access is made to place and replace tooling. In some embodiment, as in the one in FIG. 2, there may be two additional floors that are depicted as items 251 and 252. Other embodiments may have now flooring levels and access to the tools is made either by elevator means or by robotic automation that may be suspended from the ceiling of the fabricator or supported by the ground floor and allow for the automated removal, placement and replacement of tooling in the fabricator.

Description of a Chassis and a Toolpod or a Removable Tool Component

In other patent descriptions of this inventive entity (patent application Ser. No. 11/502,689 which is incorporated in its entirety for reference) description has been made of the nature of the toolPod innovation and the toolPod's chassis innovation. These constructs, which in some embodiments may be ideal for smaller tool form factors, allow for the easy replacement and removal of the processing tools. Fundamentally, the toolPod may represent a portion or an entirety of a processing tool's body. In cases where it may represent a portion, there may be multiple regions of a tool that individually may be removable. In either event, during a removal process the tool may be configured to allow for the disconnection of the toolPod from the fabricator environment, both for aspects of handling of product substrates and for the connection to utilities of a fabricator including gasses, chemicals, electrical interconnections and communication interconnections to mention a few. The toolPod represents a stand-alone entity that may be shipped from location to location for repair, manufacture, or other purposes.

Process of an Application or "Apps" Model for Tool Design Using the Toolpod Construct.

These toolPod constructs represent a novel departure from the state of the art in fabricator tooling where a tool is assembled (sometimes on a fabricator floor) and rests in place until it is decommissioned for that Fabricator. Because there are many similar functions that process tools require to operate, the toolPod for many tool types can be exactly the same with the exception of a region where the different processing may occur. In some other cases, the tool type may require different functions in the toolPod and Chassis like for example the handling of liquid chemicals as an example. Even in toolPods of this type there may be a large amount of commonality in one type of toolPod to another. This creates an infrastructure where the numbers of common components in processing tools in the industry can be large allowing for economies of scale. Additionally, these toolPods, which may result in economical costs due to the economies of scale mentioned, may provide the ideal infrastructure both for a common definition of tooling solutions for common tasks as well as an economical starting point for the development of new types of tooling or different models of existing types of tooling.

Figure 3B:
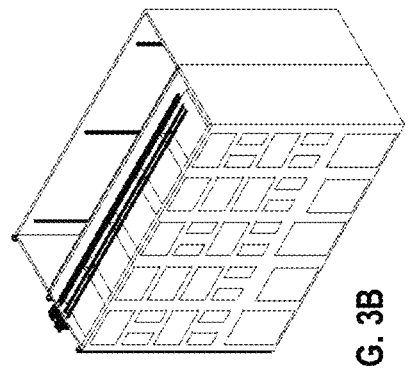
Figure 3D:
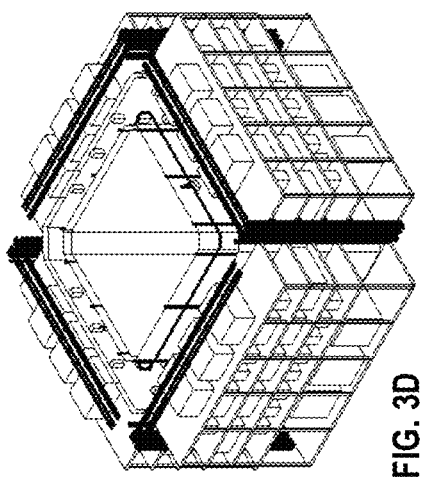
Figure 3A:
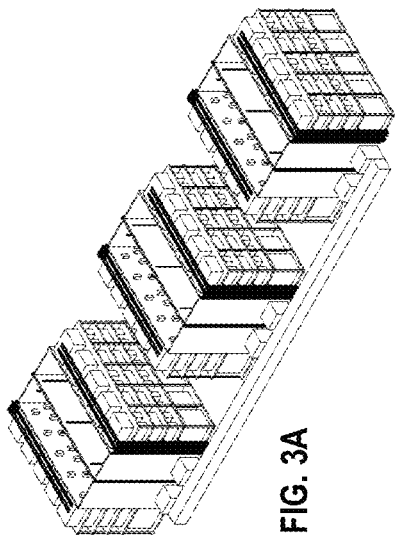
Figure 3C:
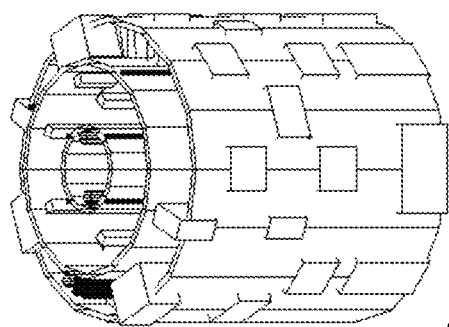

There are numerous types of cleanspace fabricators that may be consistent with the art described herein. Much of the discussion has been made in connection to vertically oriented, generally planar embodiments of a cleanspace. Referring to FIG. 3B, item 302 may represent a depiction of the general shape of such cleanspace fabricators. However, numerous other types of cleanspace fabricators and combinations of cleanspace fabricators may be consistent with the art herein. For example, compound versions of the generally planar, vertically oriented fabs may be observed as item 301 in FIG. 3A. There may also be tubular and annular tubular types of designs. Item 303, in FIG. 3C depicts a round annular tubular type cleanspace fabricator; while, item 304, in FIG. 3D may depict a rectilinear annular tubular type cleanspace fabricator. The exact nature of the cleanspace fabricator, as may be apparent, may exist in all the diversity of types of cleanspace fabricators and be consistent with establishing a retrofitting of existing manufacturing lines into cleanspace fabricators.

In FIGS. 3E, 3F, 3G, 3H, 3I, 3J and 3K, there are various embodiments of cleanspace fabricators and some exemplary derivations of those types that form fabricators with multiple cleanspace environments associated with processing substrates to different requirements of cleanliness of environment where the multiple environments are at a collocated site. Item 310 and 330 depict simple annular, tubular cleanspace fabricators. Item 310 is a round annular tubular cleanspace fabricator and item 311 may represent a typical location of a primary cleanspace in such a fabricator. Item 330 may represent a rectilinear annular tubular cleanspace fabricator with its exemplary primary cleanspace represented as item 331.

From the two basic cleanspace fabricator types, 310 and 330 a number of additional fab types may be formed by sectional cuts of the basic types. A sectional cut may result in a hemi-circular shaped fabricator, 312 with its exemplary primary cleanspace as item 313. A section cut of item 330 may result in an essentially planar cleanspace fabricator, similar to that discussed in previous figures, where the primary cleanspace is represented by item 321. And in another non-limiting example, a cleanspace fabricator of the type 332 may result from a sectional cut of type 330 where it too may have a primary cleanspace indicated by item 333.

When these various fabricator types are combined with copies of themselves or other types of cleanspace fabricators, a new type of cleanspace fabricator may result which is a composite of multiple cleanspace environments. A few of numerous combinations are depicted. For example, item 314 may represent a combination of a first fabricator of type 312 with a second fabricator 320 of this type. Item 316 may represent a first cleanspace environment in this composite fab, 314 and item 315 may represent a second type of cleanspace environment. Alternatively, item 322 may be formed by the combination of two versions of fabricator 320, where the two different primary cleanspace environments are shown as items 323 and 324. Another exemplary result may derive from the combination of two fabricators of the type 320 as shown in item 334. Item 334 may have two different primary cleanspace regions, items 336 and 335. And, in some embodiments, item 337 may represent a third cleanspace region. It may be apparent that the generality of combining two different cleanspace elements to form a composite fabricator may be extended to cover fabs made from combinations of 3 or more fabricator cleanspace elements.

Figure 4:
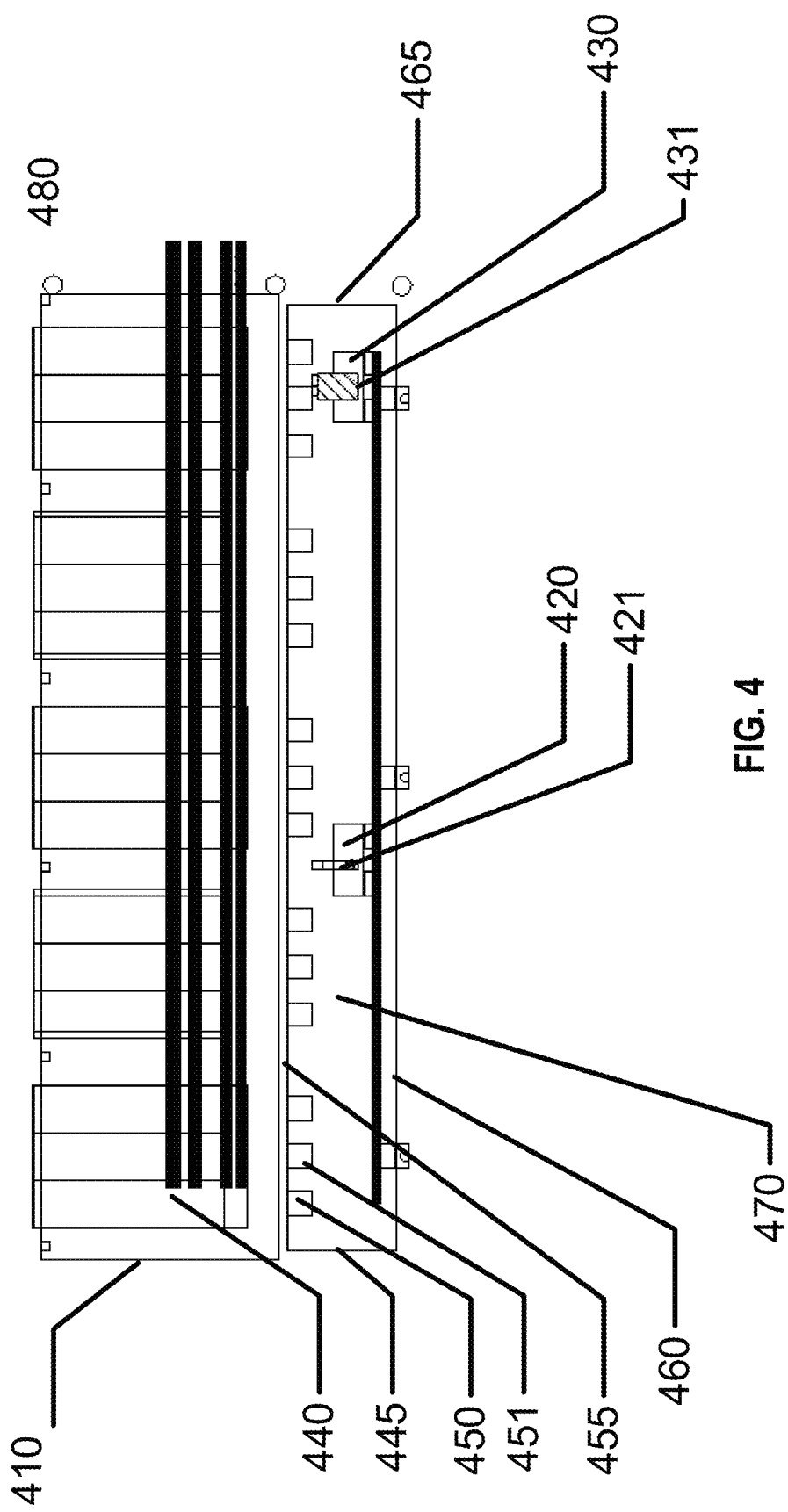
FIG. 4—An illustration of an exemplary cleanspace type design with multiple types of automation designs.

An alternative type of cleanspace environment for processing of multiple types of substrates, or multiple types of vessels or combinations of substrates and vessels may be represented by item 410 in FIG. 4. In a fabricator of this type, 410, there may be a single cleanspace environment represented as item 470. In some embodiments, this cleanspace may be defined by a unidirectional airflow flowed from or through wall 455 to wall 460 where walls 445 and 465 are flat walls. It may be clear that the various diversity described previously may include art consistent with the inventive art herein. And in some embodiments, there may be a tool port, 450 which resides significantly in the cleanspace, 470, which may be called a fabricator cleanspace in some embodiments, while a tool body 440, resides outside this first cleanspace 470.

In some embodiments, the cleanliness of the cleanspace environment, 470, may be uniformly at the highest specification required for any of the processing in the fabricator environment. In such embodiments, therefore, the environment may exceed the needs of other processing steps that are performed within it. Since there may be multiple types of substrates and/or vessels processed in the environment, as for example wafers, die form, liquids, powders, emulsions, or suspensions in a non-limiting sense, there may need for multiple different types of automation present to move substrates or vessels from tool port to tool port. For example, item 420 may represent a robot that is capable of moving wafer carriers through the use of a robotic arm 421. And, item 430 may represent a piece of automation that is capable of moving vessels through use of a different robotic arm 431, from tool port to tool port. In fabricators of this type, in some embodiments there may be tools that have two different types of tool port on them, one consistent with handling a first type of substrate like for example wafer carriers and another capable of handling vessels.

In some embodiments, in a non-limiting sense, such a tool might include a tool for performing a chemical separation. In this case, carriers with substrates may be input into the tool through one port shown for example as item 450 and then vessels may leave the tool through tool port 451.

Other manners of processing multiple substrates or vessels may include for example tools which take substrate carriers or vessels from a region external to the cleanspace fabricator like item 480 and place them into the cleanspace environment through a tool port. In a similar fashion, substrates or vessels in various types of carriers may also exit the fabricator environment through a processing tool to an external environment like 480 as well. Alternatively there may be other means to directly introduce or remove substrate carriers into the cleanspace environment directly through a cleanspace wall, for example through wall 445.

In any of the cleanspace fabricator embodiments where multiple types of substrates or vessels are processed within a single type of cleanspace environment there may be need for multiple types of automation. This may be true for the type of single fabricator environment shown in FIG. 4 or alternatively for the composite types shown previously where multiple substrate types are processed. It may be clear, that another embodiment may derive where the automation devices, like item 420, are capable of handling multiple substrate carrier types.

Cleanspace Fabricators where Tools May be Removed from the Same Side of a Tool Stack as where Substrates and Vessels are Accessed for Movement from Tool to Tool.

Figure 5A:
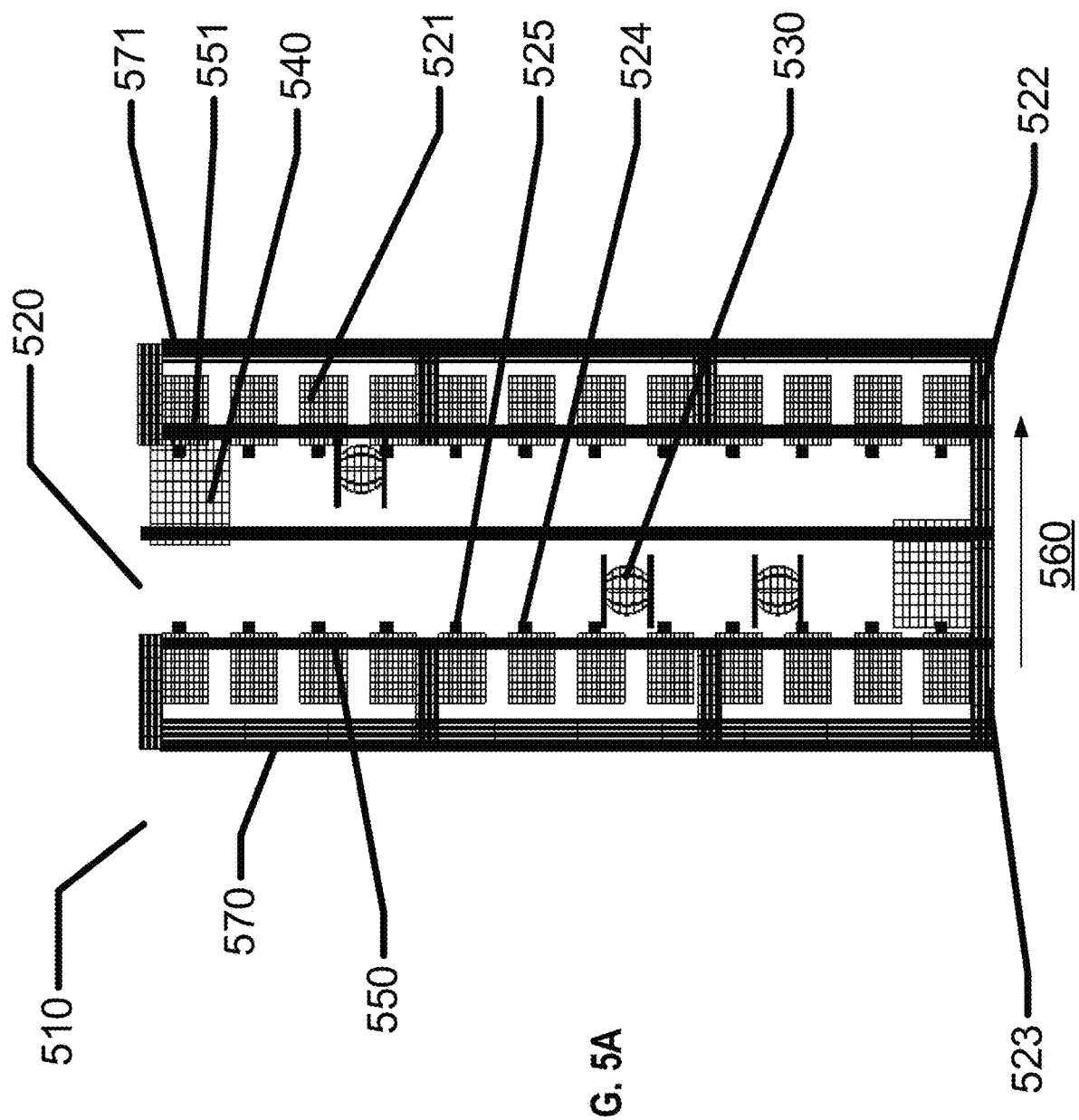
FIG. 5A—An illustration of a cleanspace fabricator design with tool automation and substrate/vessel transportation in same cleanspace region.

Referring to FIG. 5A, an exemplary cleanspace fabricator of a different design type may be found. In this design type, a the cleanspace related region of the fabricator 510 is constructed with a vertically deployed cleanspace region 520. Tools 521 may be deployed on one side 522 and on another side 523 of the cleanspace region 520. In some embodiments, tools may be deployed on just one of the sides of the cleanspace region. There may be automation 530 that may be useful for moving substrates or vessels from a tool port 524 to another tool port 525. There may also be tool movement automation 540 that may be used to move tools from a tool pod position on a tool chassis.

The example of FIG. 5A is provided for a straight linear type fabricator design; however, the various examples that have been described in the present disclosure can have a cleanspace with two peripheries or sides. There may be manners of operating such a cleanspace design without the use of tool movement automation 540.

In some examples, there may be walls 550, 551 with numerous perforations. The wall may provide a means of defining filtered air to flow 560 from one side of the cleanspace to another as depicted by the arrow. Air flow may also be defined from the more exterior walls depicted at 570 and 571. In some examples the air flow may occur from both 570 and 550 to 551 and 571. There may be various alternatives to define a clean air flow in the cleanspace region. In some examples vertical air flow may also be defined. It may be possible to classify the entire cleanspace from exterior wall 570 to exterior wall 571 as a primary cleanspace, and it may be novel to include processing tools with tool chassis and the movement of work product in such manners. It may also be possible to define primary cleanspace regions from 550 and 551 and also to define secondary cleanspace regions from exterior wall 570 to wall 550 and also from exterior wall 571 to wall 551. The various examples discussed in the present disclosure may be applied in various forms to cleanspace fabricators where tools may be removed from the same side of a tool stack as where substrates and vessels are accessed for movement from tool to tool.

Figure 5B:
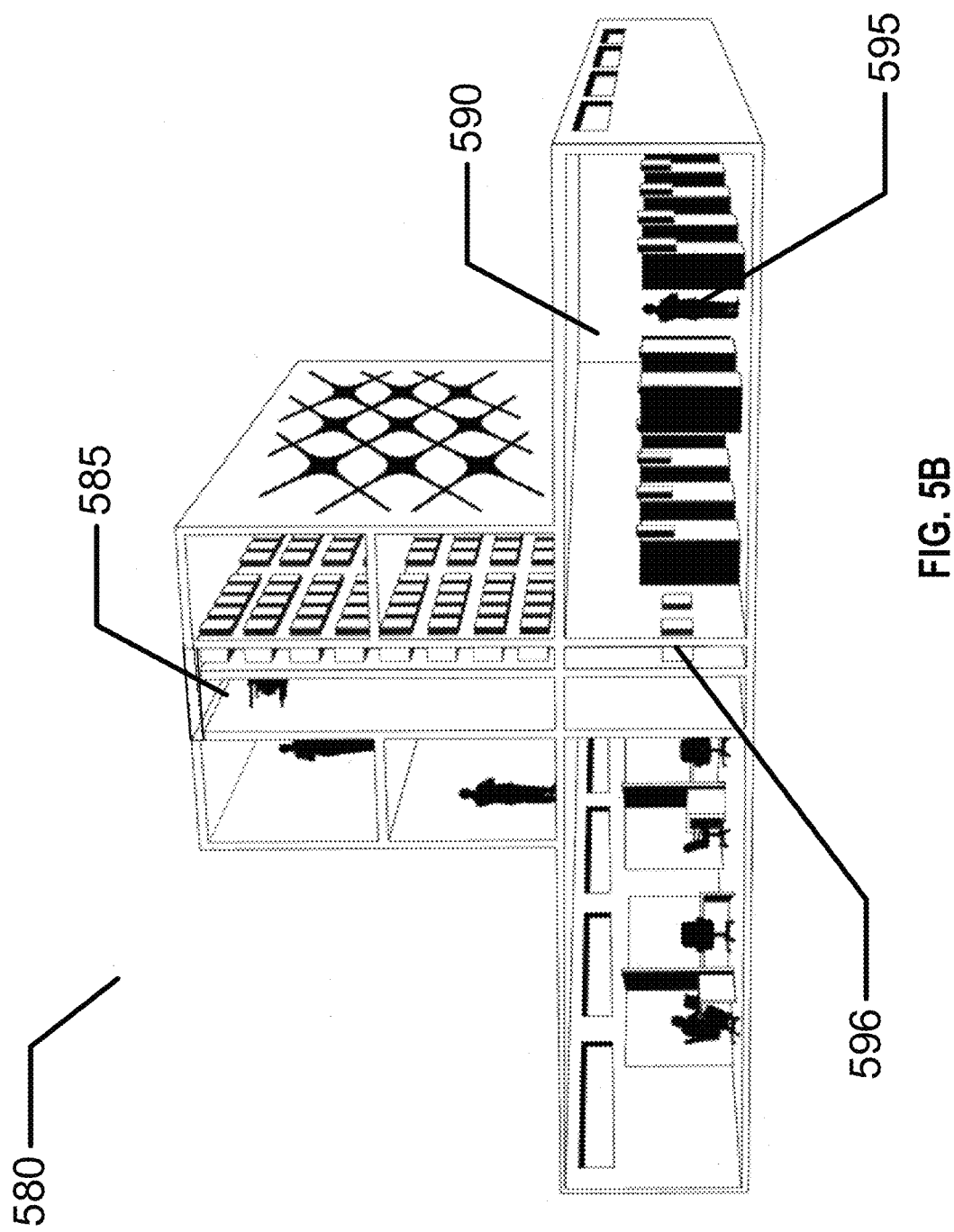
FIG. 5B—An illustration of a hybrid cleanspace and cleanroom fabricator design.

Hybrid Fabricators with Portions Formed as Cleanspace Fabricator Type Designs and Portions Formed as Cleanroom Type Designs Referring to FIG. 5B, an example of a hybrid type fabricator may be found. A hybrid fabricator may be an example of a fabricator formed where portions of the fabricator are based upon the types of designs for cleanspace fabricators as have been variously described in the present disclosure are combined with portions that are of the cleanroom type. A hybrid fabricator 580, may be comprised of a portion that is of a cleanspace type 585 and a portion that is of a cleanroom type 590. Personnel 595, may work in the cleanroom type 590 whereas, as may be typical of some cleanspace type 585 fabricators only substrates or vessels may be located in this region. There may be regions that act as an interface 596 of such a hybrid fabricator that serve to transfer product from the cleanroom type 590 region to the cleanspace type 585 region. The example of FIG. 5B may represent a linear type cleanspace region where an exemplary cleanroom type region may be located at a ground or first level. The nature of the hybrid fabricator, however, is based upon the combination of cleanroom type regions and cleanspace type regions and the nature of such regions can assume the various diversity that may be formed for such types of fabricators. In some examples the cleanroom type region may be located at a first level or at a higher level. In some other examples, there may be multiple levels of the cleanspace type fabricator levels as well as multiple levels of cleanroom type fabricator regions.

It may be advantageous for the cleanspace type regions to share an interface with each of the cleanroom type regions. Such an example may be found in FIG. 5B at the interface 596.

Support of Hybrid Fabricators and Fabricators with Vertically Stacked Tools Accessible and Replaceable from the Cleanspace Region.

Figure 6:
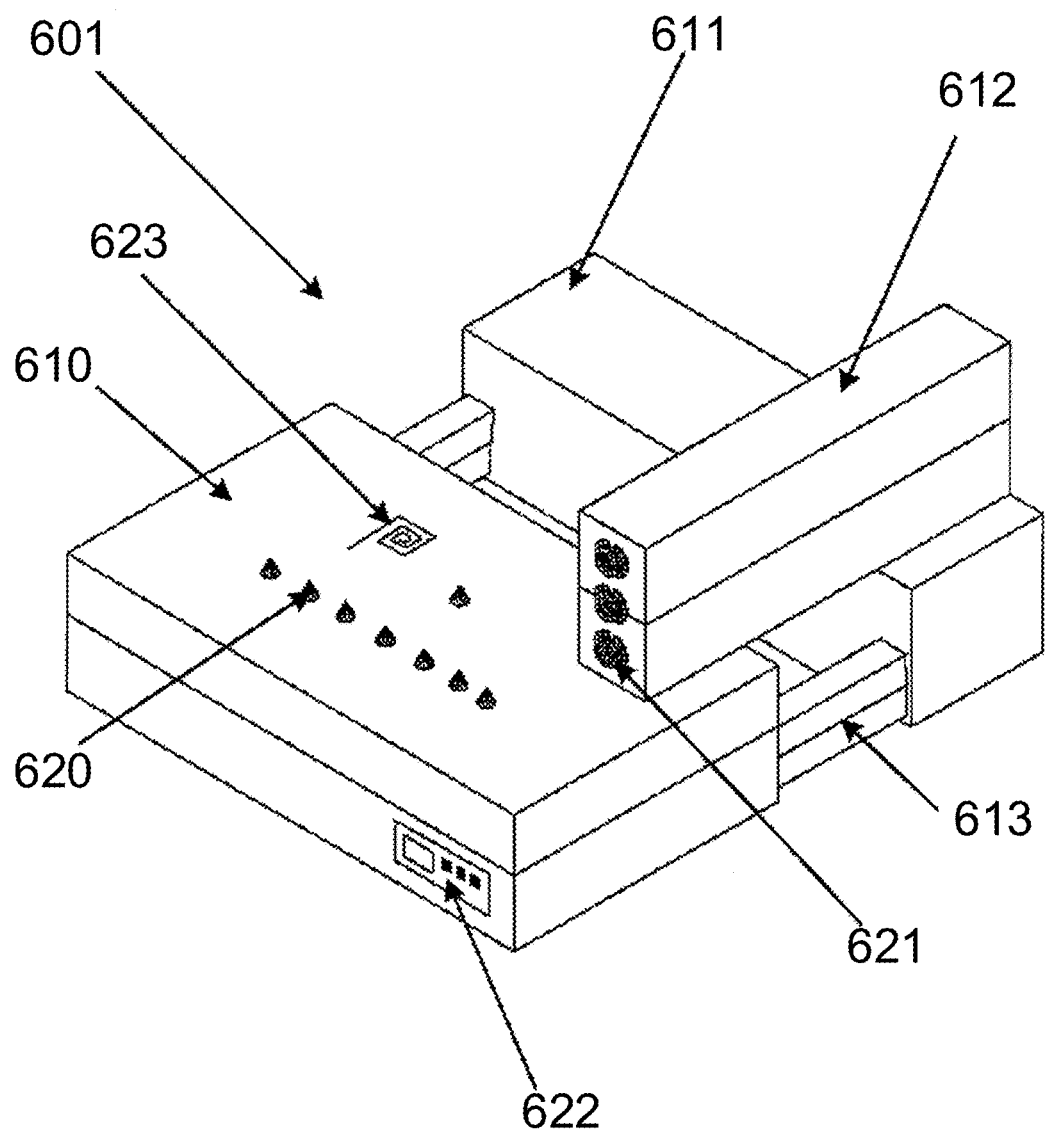
FIG. 6—An illustration of an exemplary Chassis Embodiment.

Referring now to FIG. 6 a chassis 601 which may also be referred to as a tool chassis or a tool support chassis is illustrated according to some embodiments of the present invention. Base plates 610-611 attached to a sliding rail system 613 provide an installation location for a processing tool body (not illustrated). Base plate 611 is physically fixed in an appropriate location of a fabricator. In some embodiments, base plate 611 would not interact directly with the tool body, however, in some embodiments, a tool body can be fixedly attached to the base plate 611. In both embodiments, base plate 610 can physically support a tool body mounted on the chassis 601 to support the tool.

In FIG. 6, the orientation of two base plates 610-611 is shown with the base plates separated. The chassis 601 can have multiple service location orientations. A first location, as shown in the drawing, can involve an extended location, such that the placement and removal of a tool body from the base plate 610 can occur in an exposed location. An exposed location, for example, can facilitate placement of a new tool onto the chassis 610. A second service location allows the chassis 601 to relocate such that both chassis plates 610 and 611 are close together. An illustration of an exemplary second service location is provided in FIG. 10 including plates 1010 and 1011.

In some embodiments, physical tabs 620 may stick out of the chassis top plate 610. The physical tabs 620 may serve one or more purposes. As a physical extension, the tabs 620 will have a corresponding indentation (not illustrated) in the mating plate or a surface of a tool body to be placed on the tabs 620. As the tool body is lowered over the chassis 610, the tool body will reach a location as defined by tabs 620. In some embodiments, the tabs 620 can additionally provide electrical connection between the chassis 610 and the tool body. Electrical connection can serve one or more of the purposes of: electrical power connection and electrical data signal connection.

In some embodiments, a wireless interface 623 can provide wireless electrical connection between the tool body and the chassis. The wireless interface 623 can be redundant to hardwire data connections or take the place of hardwire data connection. The wireless interface can also be utilized for other electrical connections, as discussed for items. In some embodiments, a wireless coupling 623 can provide one or both of electrical power and data communication.

Connections for non-electrical utilities 621 can also be provided. Fixtures 621 can be used for defining a connection, for example, of one or more of: gas, vacuum, fluids waste lines, compresses air, deionized water, chemicals and the like. Various conduits 612 can carry these utilities to the fixtures 621 and be routed, for example, through the chassis 601. The conduits 612 can be connected to appropriate facility supply systems, air flow systems and drains to provide for safe operation. In reference to FIG. 10, the various references described for FIG. 6 may have a corresponding item reference in FIG. 10. Therefore, the functions of 601 may equate with 1001, 610 with 1010, 611 with 1011, 612 with 1012, 620 with 1020, 621 with 1021 and 622 with 1022 just where the reference is for where the chassis is in a different state for FIG. 6, open and FIG. 10, closed.

Figure 7:
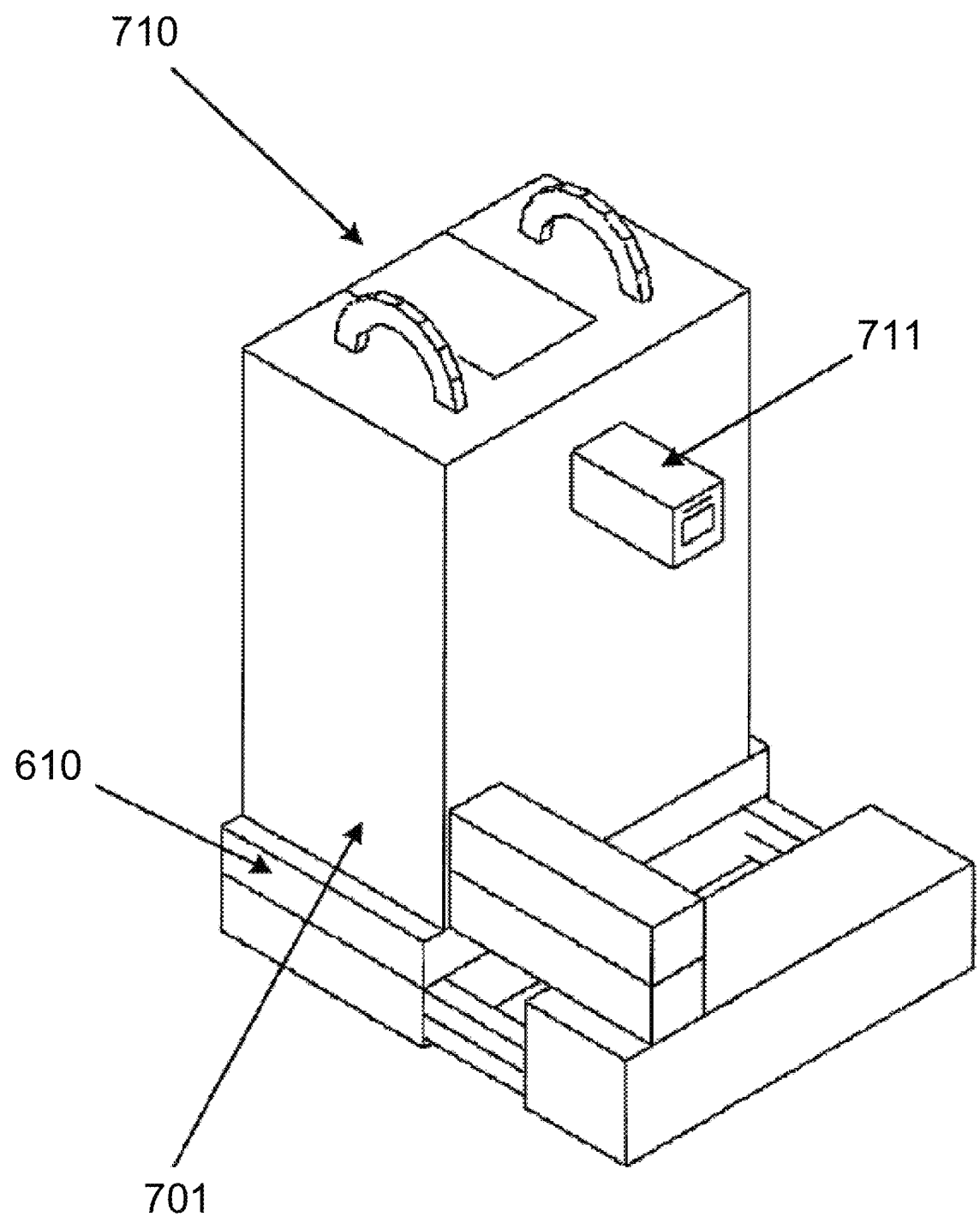
FIG. 7—An illustration of an exemplary Chassis Embodiment from a Front View with Tool Body Placed.

Referring now to FIG. 7, a tool body 701 can be placed onto the chassis plate 710. The tool body 701 is illustrated in a generic box, however, any type of processing tool, such as those required for semiconductor manufacture or chemical manufacture of materials contained in a vessel, is within the scope of the invention. In some embodiments, the underside of a tool body 701 can include a mating plate which physically interfaces with a chassis 610.

The present invention includes apparatus to facilitate placement of processing toolPods 710 with toolports 711 and their bodies 701 in a fab and the methods for using such placement. The chassis 701 design can be capable of assuming two defined positions; one extended position places an interface plate external to the environment that the tool assumes when it is processing. This allows for easy placement and removal. The other position can be the location where the tooling sits when it is capable of processing.

The exact placement of the tooling afforded by the chassis 610 allows for more rational interconnection to facilities and utilities and also for the interfacing of the tool body 701 with fab automation. The chassis 610 can have automated operations capabilities that interface with the tool body and the fab operation to ensure safe controlled operation.

In another aspect of the invention, a processing tool 710 can transfer a material, such as, for example, a semiconductor substrate, in and out of a tool body 701. In FIG. 7, a tool port 711 can be used for coordinating transfer of a material into and out of the tool port 711 and maintaining cleanspace integrity of a tool body 701 interior. As can be seen in FIG. 7 this embodiment contemplates placing the tool port 711 in a manner physically connected to the tool body 701. A further purpose of the movement of the chassis 610 from its extended position to its closed position would be the movement of the tool port 711 through an opening in a clean space wall. This would allow the tool port 711 to occupy a position in a clean space so that fabricator logistics equipment can hand off substrates and carriers of substrates to the tool port 711.

Figure 8:
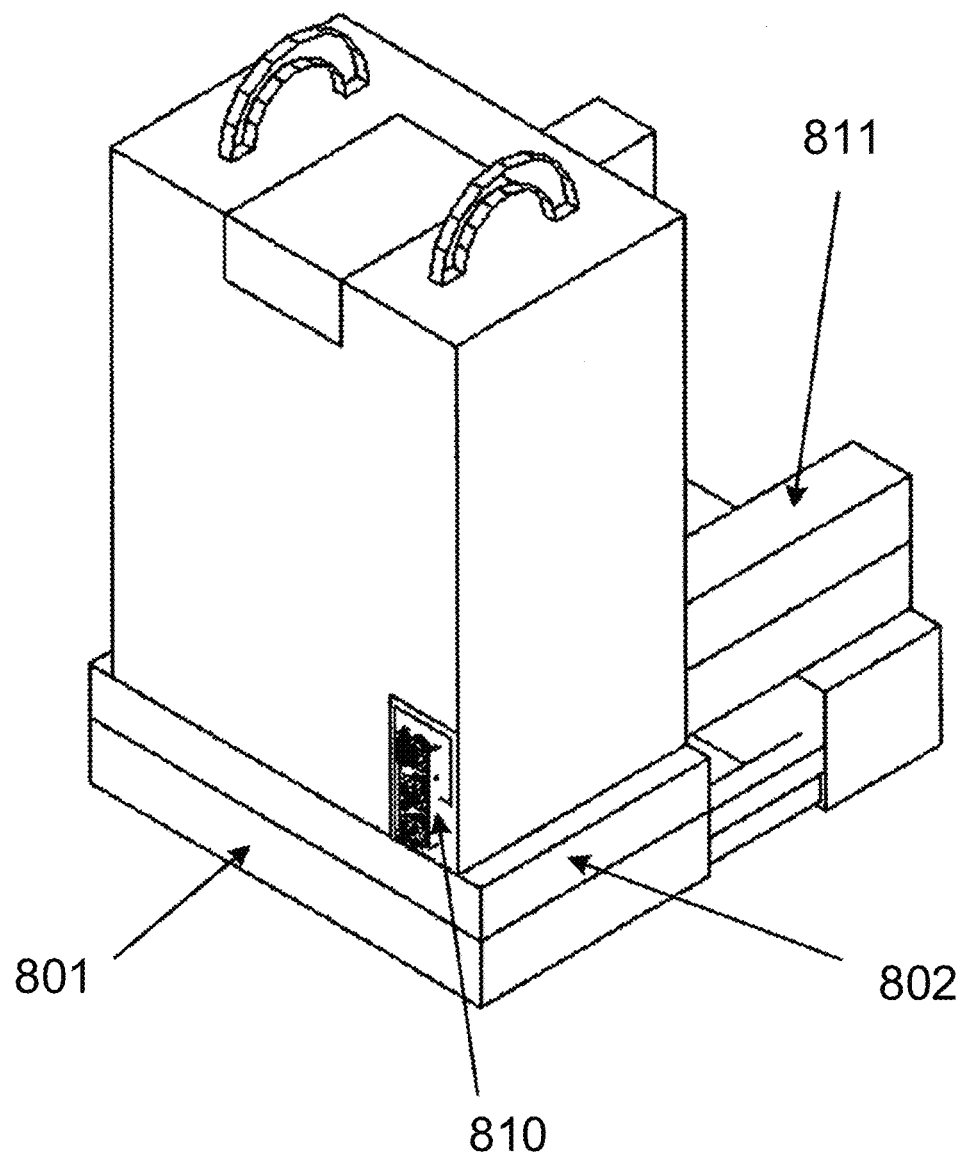
FIG. 8—An illustration of an exemplary Chassis Embodiment from a Rear View with Tool Body Placed.
Figure 10:
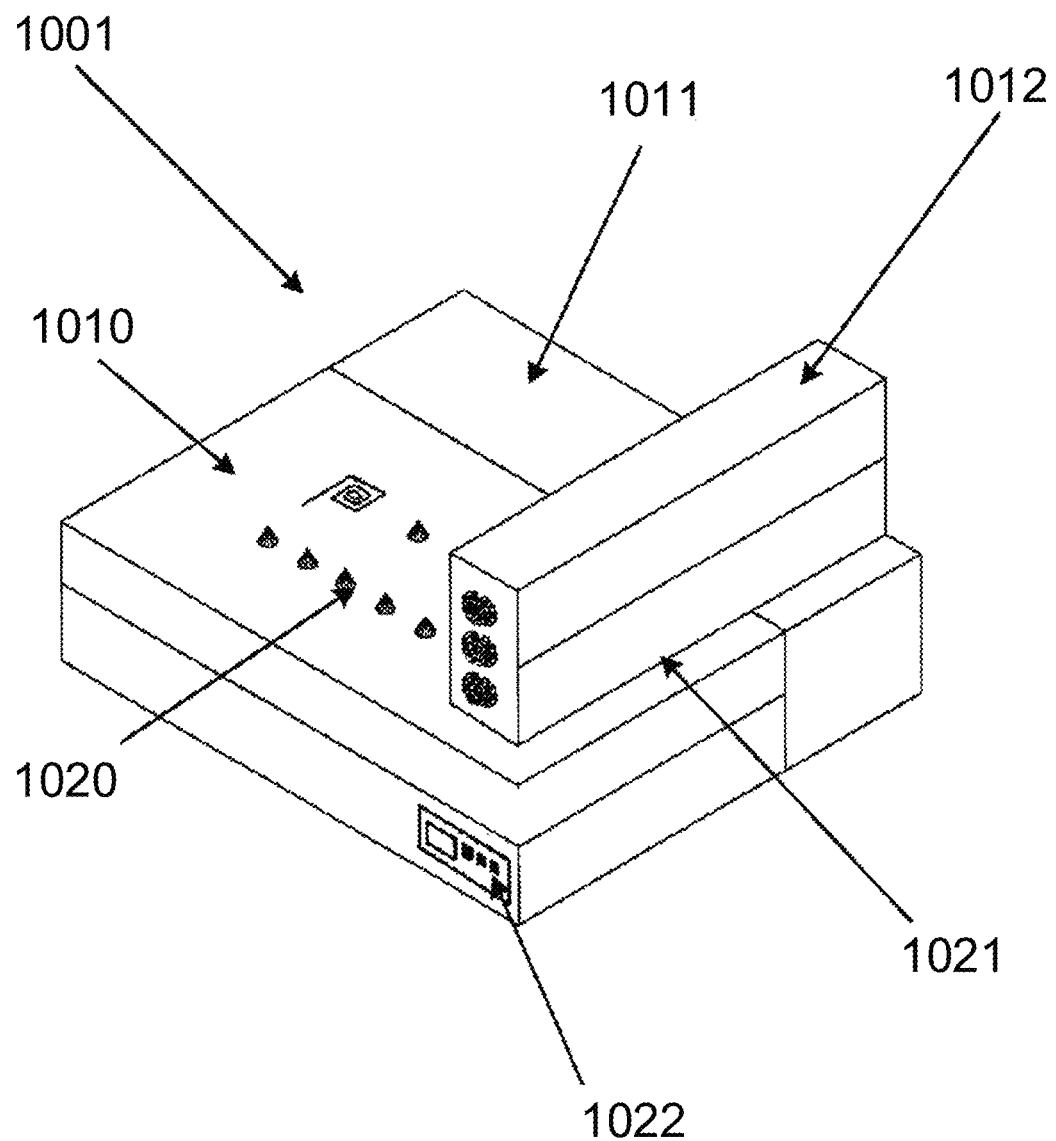
FIG. 10—An illustration of an exemplary chassis design that may be viewed without an exemplary toolPod placed thereupon.

Referring now to FIG. 8, in some embodiments, a tool body 801 can include a specifically located set of mating pieces 810 for connecting the tool body 801 and its base plate 802 to facility supplied utilities. When the tool and chassis are moved from an extended position as shown in FIG. 6 to a closed position as shown in FIG. 10, such movement can place tool connections 810 in proximity to the facilities connections 621 and 811 and thereby allow for connection of various utilities. In some embodiments, as a processing tool 801 is connected, various aspects of tool automation electronics can monitor the connection and determine when the connections are in a safe operating mode. Such tool automation electronics can communicate to the tool body 801 and to the tool chassis to identify a state that the connections and supply conduits are in.

In still another aspect of the invention, in some embodiments, control automation can be contained within the chassis for various aspects of the operation of the chassis. It is within the scope of the present invention to monitor and control multiple states related to the chassis via electronic included in the chassis. Such states can include, by way of example, a physical location of a chassis in an extended or closed state. Therefore, for example, if a processing tool 801 and chassis are in a closed and operational state, a technical operator may issue a command to the chassis to move to an extended location. Such communication could occur through a control panel 622 or through wireless communication to the chassis 601 through wireless receivers 623. Control of the processing tools can be accomplished with any known machine controller technology, including for example a processor running executable software and generating a human readable interface.

In some embodiments, a command to move the chassis 601 to an extended location can also initiate, amongst other algorithmic functions, a check for the status of utilities connections. It is also within the scope of this invention to require any such utility connections to be rendered into a state of disconnect before the chassis 601 can proceed to an extended position.

Similarly, in some embodiments, prior to operations such as extension of a chassis 601, processing steps can determine that a tool body 801 did not contain any substrates or vessels prior to extension of the chassis 601. It is also within the scope of the present invention for communication modes included within the chassis 601 to communicate with fab wide automation systems for purposes such as tracking the location of substrates or vessels; tracking the identity of tools; and tracking the status of tools 710. If connections to a tool 710 and chassis 601 are in a proper state then the chassis can move into an extended position allowing for removal of the tool body 801 and replacement with a similar tool body 801.

In some embodiments of the present invention, a fabricator will include automation to handle substrates or vessels and control their processing. And, in many cases the substrates or vessels can move from tool to tool in a specialized carrier which contains the substrates or vessels. The specialized carriers can be transported via automation which includes automated transport systems. The carriers can thereby be presented to one or more processing tool interfaces, also referred to herein as a "port". The automation allows for movement of the substrates or vessels around the fab and for loading and unloading the substrates or vessels from a processing tool. Substrates or vessels can include, for example and without limitation, wafers for semiconductor processing, microelectronic machines, nanotechnology, photonic, and biotechnological carriers.

A substrate processing tool port can support processing tools and handle wafers and wafer carriers in an environment attached to the tool body. The tool port can penetrate a clean space containment wall and the tool body can enable routine placement and replacement into the fabricator environment.

As described above, according to the present invention, processing tools reside with their tool bodies in a position which allows the tool body to be outside of a cleanspace with a tool port operatively attached to the tool body inside of the cleanspace. For example, embodiments can include a tool body adjacent to, or on the periphery of, a clean space of the fabricator and the tool port extending into the cleanspace. Each tool body can be removed and replaced in a standardized process and without requiring the removal of adjacent tool bodies. The present invention also anticipates the automated transfer of substrates or vessels from a first tool port of a first processing tool to a second tool port of a second processing tool, while maintaining the substrate in a clean space environment via a clean carrier.

Embodiments therefore include tool ports that are capable of receiving a carrier or vessel from the automated transport system. Each carrier or vessel can contain at least one substrate. The automated transport unloads the carriers or vessels and passes them off to the processing tools automation systems. In some embodiments, the port size enables it to span a wall used for the definition of a primary clean space of the fabricator. Inside the primary clean space resides the entry area of the tool port. The tool port's body can span a distance in excess of the width of the clean space wall to allow for substrates or vessels which are unloaded from their carrier to be robotically handed off to the tool body's automation.

The novel tool port can incorporate various levels of automated carrier, substrate and vessel handling apparatus. For example, in some embodiments, the carrier and vessel handling apparatus can include communication systems which receive data from electronic sensors monitoring each port, processing tools and transport apparatus. In another aspect, a substrate or vessel can be contained within a controlled ambient environment while it is within the storage carrier, port and processing tool.

Figure 9:
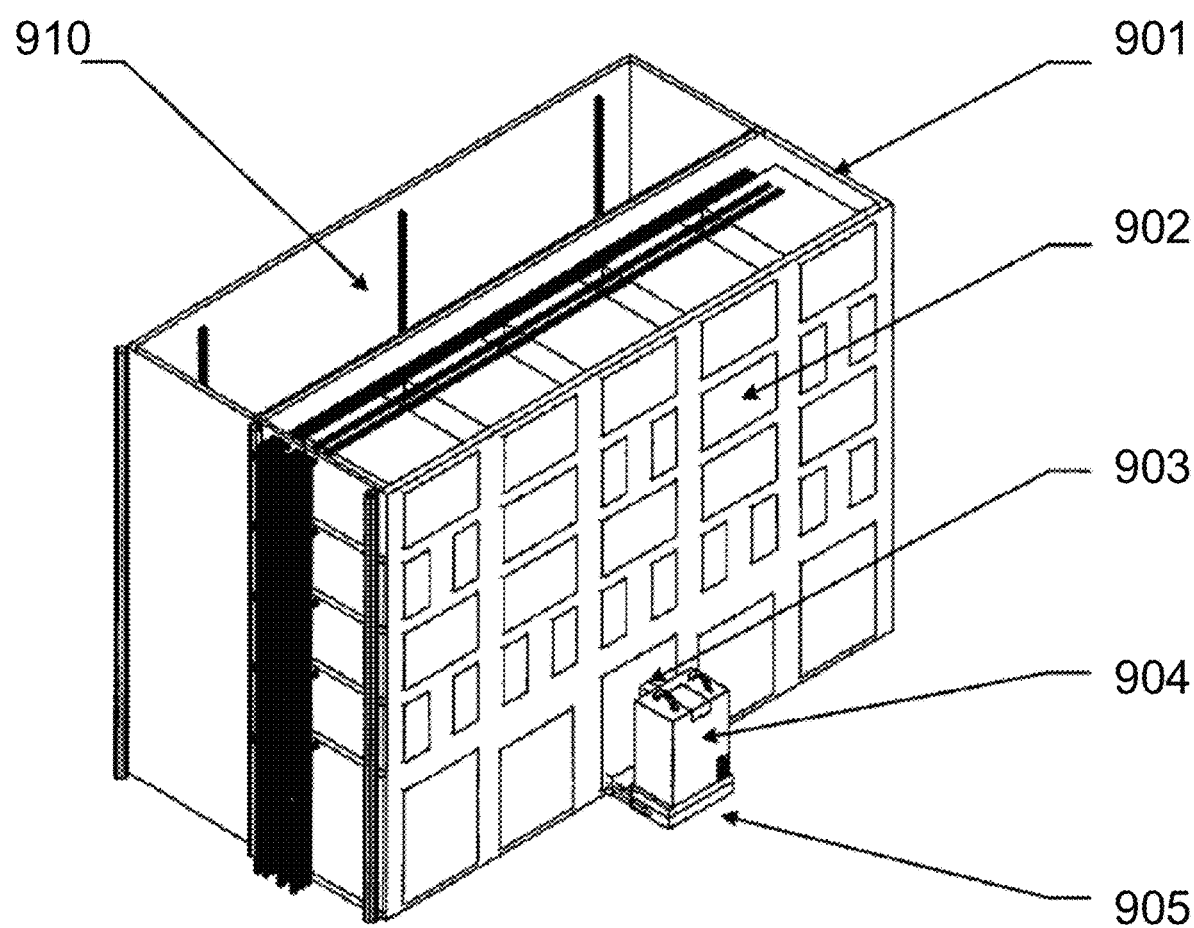
FIG. 9—An illustration of an exemplary Placement in an Exemplary Fab Design

FIG. 9 illustrates a perspective view of how a port 903 according to the present invention is operatively attached to a tool which is easily placed and replaced. In some embodiments, a fabricator 901 has a series of stacked tools 902. When a tool 902 is being placed or replaced it sits in a retracted position 905 relative to a normal position 902 in a fabricator. The tool body, 904, is shown in its retracted position, 905. As illustrated, the tool port 903 is located on a side of the tool body 904 with the furthest edge just visible.

Figure 11:
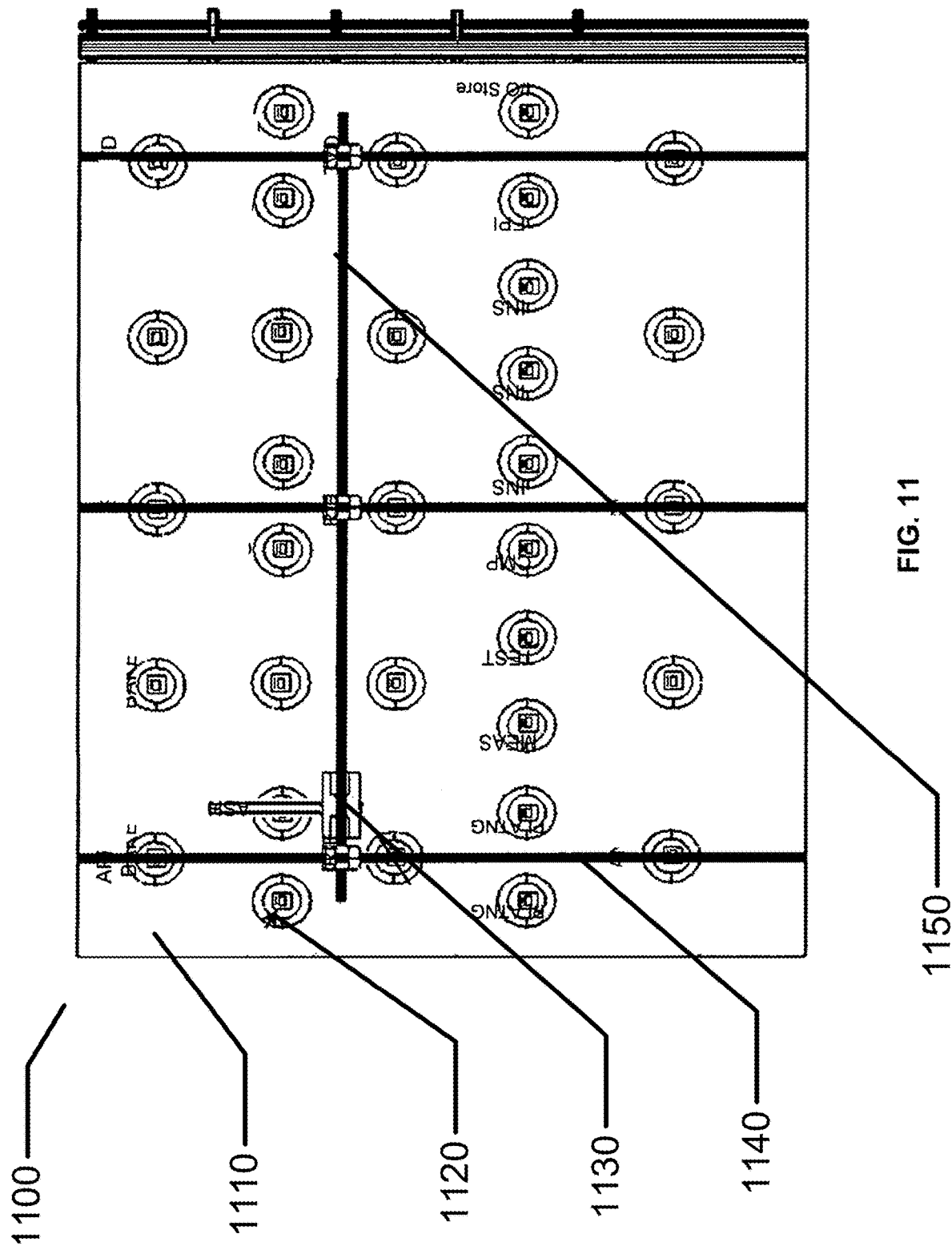
FIG. 11—An illustration of an exemplary view of a vertical type fabricator design wherein tool ports from different tools may be observed.

Referring to FIG. 11, item 1100, a depiction of the inside of the primary cleanspace 910 of FIG. 9 while looking at the wall adjacent to the tool positions, which in this drawing is now represented in plan view as item 1110, may be observed. Multiple tool ports may be represented as the round shaped features, as an example item 1120. In this perspective view the automation may, in a non-limiting example embodiment, consist of linear rails that allow movement along a vertical dimension, item 1140, for example and along a horizontal dimension, item 1150. The automation handler that receives carriers or substrates or vessels may be identified as item 1130. It may be noticed in this example that since the automation is able to address any tool port by a direct movement from a first tool port that the layout of the tool bodies and the associated location of the tool ports may be less structured as compared to previous examples. As may be apparent, there may be numerous manners to deploy tools and handle substrates or vessels within the primary cleanspace that would be consistent with the art herein.

A more general design of the fabricator types in the present disclosure may comprise at least a portion that comprises a vertically deployed automation space. In each of the examples that have been described herein, a cleanspace may be viewed as an automation space that happens to achieve a particular level of cleanliness. In some embodiments, the cleanliness level may be relatively unclean or in some embodiments, the vertically deployed automation space may not even have active aspects that improve the level of cleanliness of the space.

In the processing of vessels there may be various chemical and biological processing steps in a non-limiting perspective that are performed. Pharmaceuticals, bioengineering products, antibiotics, pills and other such products may be produced using the various embodiments described herein. Some of these products may include additional cleanliness aspects in the production processes. Therefore, the environment of primary and secondary cleanspace regions as well as regions within toolPods may have sterile, antiseptic or anti-biologic aspects that may be supplementary to particulate control and may involve, in a non-limiting sense, high energy sources such as UV light, chemical and gas phase sterilizing materials and such techniques.

In another example, processing tools may be moved around in the cleanspace to substrates, vessels and/or containers that are stationary in a location in a vertically oriented fabricator. In a non-limiting example, an application of such an arrangement may be processing of replacement organs and tissues. In such an example, a particular location may be accessible from outside the cleanspace on a peripherally located position, and access to the substrate, vessel and/or container may occur in much the same manner that processing tools may be accessed in previously disclosed examples of cleanspace fabricators. In such an example, the work product may have better quality when it remains stationary and then processing tools such as 3D printers, for example, may be moved in proximity to the work product within the cleanspace; wherein the cleanspace is kept clean from a particulate, biological and environmental (i.e. temp, humidity, chemicals, and the like).

Figure 12:
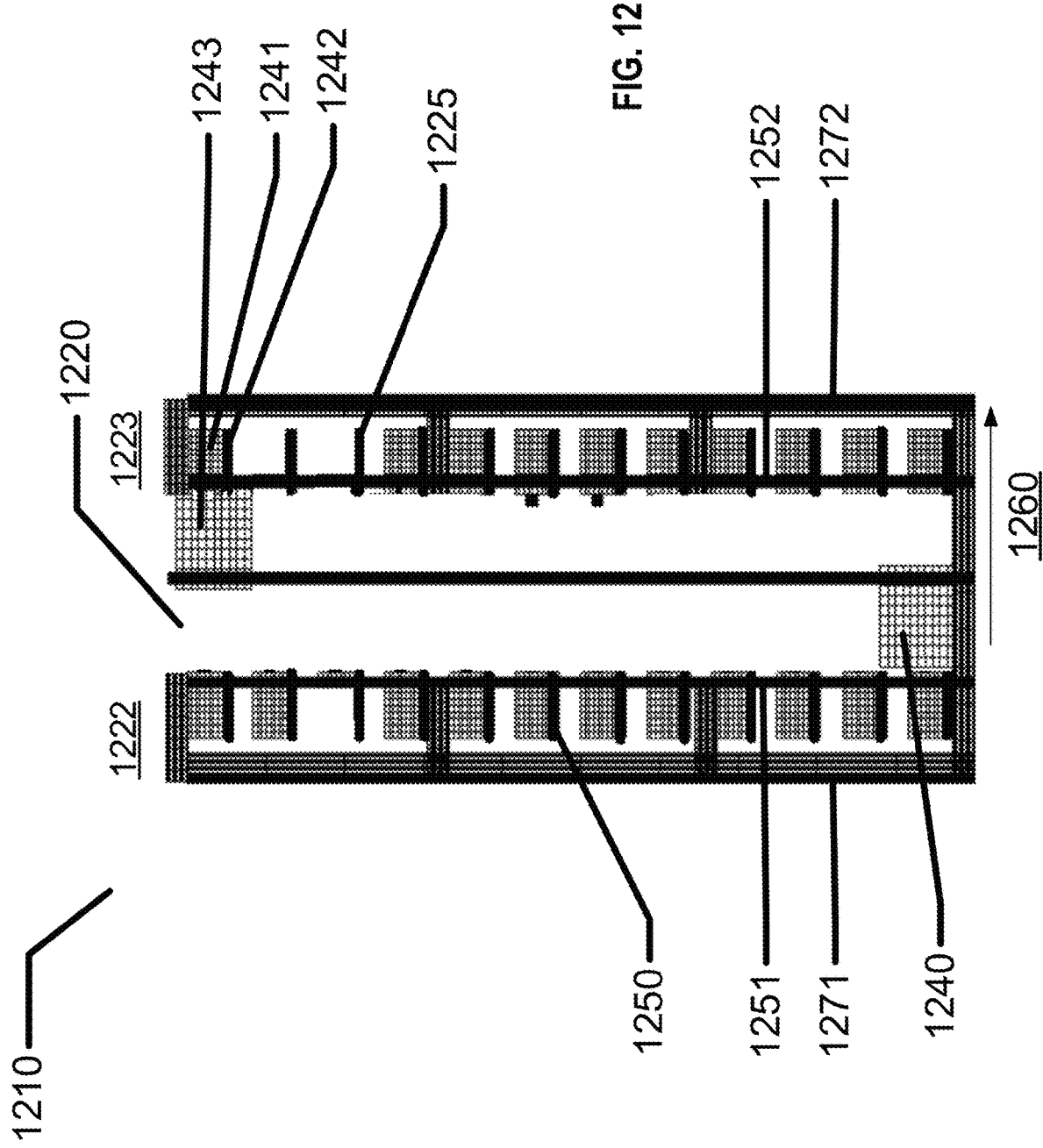
FIG. 12—An illustration of an exemplary view of a vertical type fabricator design wherein tools are moved within the cleanspace to substrates.

Proceeding to FIG. 12, an exemplary cleanspace fabricator of this type may be found. In this design type, a the cleanspace related region of the fabricator 1210 is constructed with a vertically deployed cleanspace region 1220. Tools 1251 may be deployed on one side 1222 and on another side 1223 of the cleanspace region 1220. In some embodiments, tools may be deployed on just one of the sides of the cleanspace region. There may be tool movement automation 1240 that may be used to move tools from a tool pod position on a tool chassis.

The example of FIG. 12 is provided for a straight linear type fabricator design; however, the various examples that have been described in the present disclosure can have a cleanspace with two peripheries or sides. There may be manners of operating such a cleanspace design without the use of tool movement automation 1240.

In some examples, there may be walls 1251, 1252 with numerous perforations. The wall may provide a means of defining filtered air to flow 1260 from one side of the cleanspace to another as depicted by the arrow. Air flow may also be defined from the more exterior walls depicted at 1271 and 1272. In some examples the air flow may occur from both 1271 and 1251 to 1252 and 1272. There may be various alternatives to define a clean air flow in the cleanspace region. In some examples vertical air flow may also be defined. It may be possible to classify the entire cleanspace from exterior wall 1271 to exterior wall 1272 as a primary cleanspace. It may also be possible to define primary cleanspace regions from 1251 and 1252 and also to define secondary cleanspace regions from exterior wall 1271 to wall 1251 and also from exterior wall 1272 to wall 1252. The various examples discussed in the present disclosure may be applied in various forms to cleanspace fabricators where tools may be removed from the same side of a tool stack as where substrates and vessels are accessed for movement from tool to tool.

In some examples, a substrate, vessel or container may be located within the fabricator without a processing tool above it. As an example, vessel 1225 may be depicted without a tool. In an alternative, tool 1241 may be depicted with an automation unit 1243 in the process of removing the tool over its vessel 1242. A tool upon a vessel 1250 is depicted as well.

Roll to Roll and Belt Driven Automation

In some examples a product may be processed in a cleanspace fabricator where the means of automation of the substrates and substrate carriers occurs with a driven belt. In some examples the belt may cycle through many levels in a fabricator, in other examples the belt may convey work products along a single level and other automation may move work product between levels. In a variant of the example, the processing may occur by means of roll to roll processing where tools may interact with the roll or rolls. Hereto, in some examples the roll to roll processing may occur in a single level of a cleanspace fabricator where the roll is present in the cleanspace.

Figure 13:
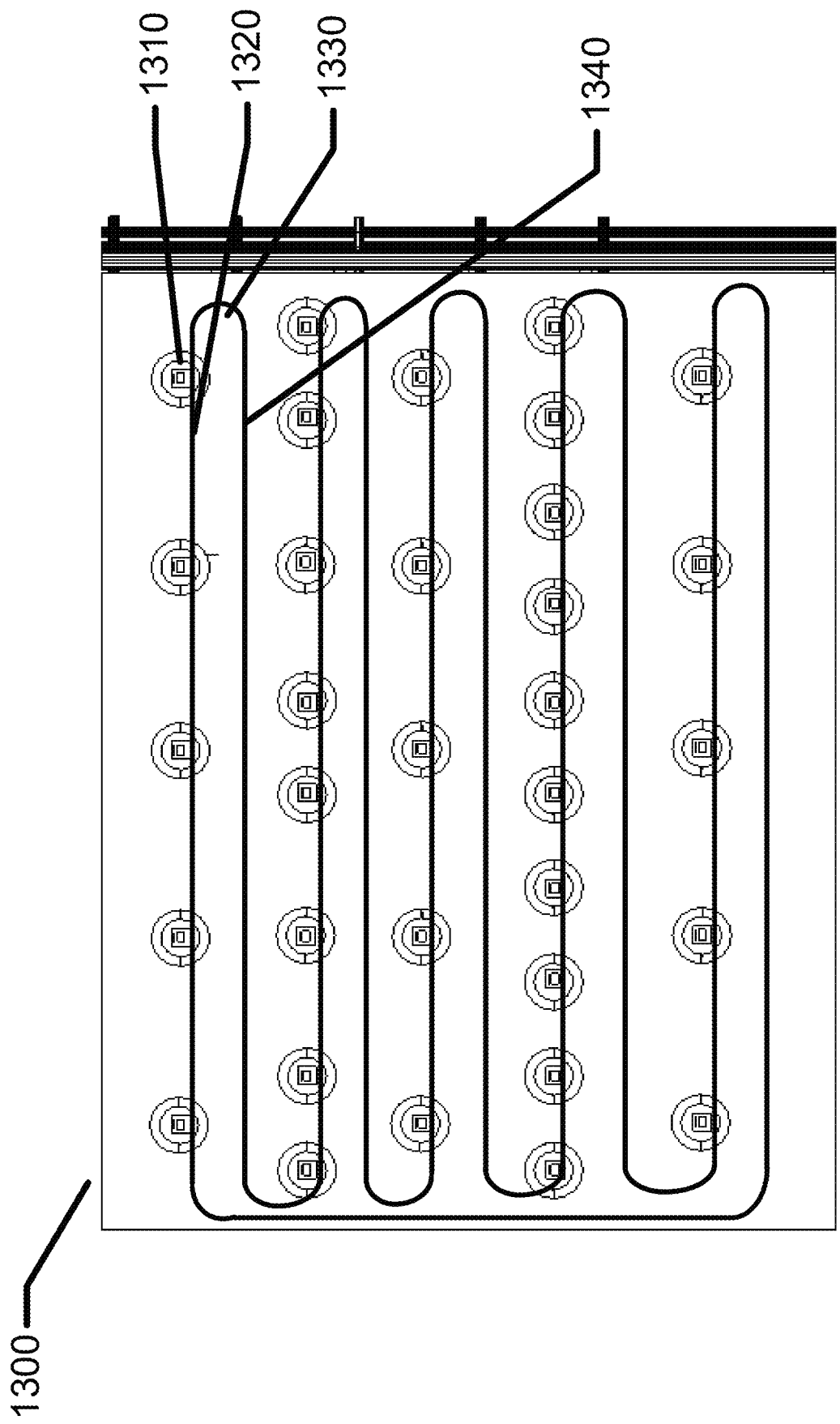
FIG. 13—An illustration of an exemplary view of a vertical type fabricator design wherein substrates are moved along a conveyor system or a roll to roll processing automation.

Proceeding to FIG. 13 an illustration of an example of Belt driven or roll to roll processing may be found. A view from the inside of a cleanspace of a cleanspace fabricator 1300 may be found. Projecting into the cleanspace may be tool ports 1310 of various kinds. These tool ports may interact with a belt 1320 which may in some examples proceed horizontally along a level and then turn 1330 at the end of a level and proceed in an opposite direction 1340 between horizontal layers of tool ports. The tool ports may hand off and pick up substrates, vessels and/or containers of various types and pass them into the tool. In different examples a processing portion of the processing tool may protrude into the cleanspace where the normal tool ports 1310 would be located, and this processing portion may interact with a substrate, vessel and or container or in other examples it may interact with a processing roll involved in roll to roll transfer processing.

Figure 14:
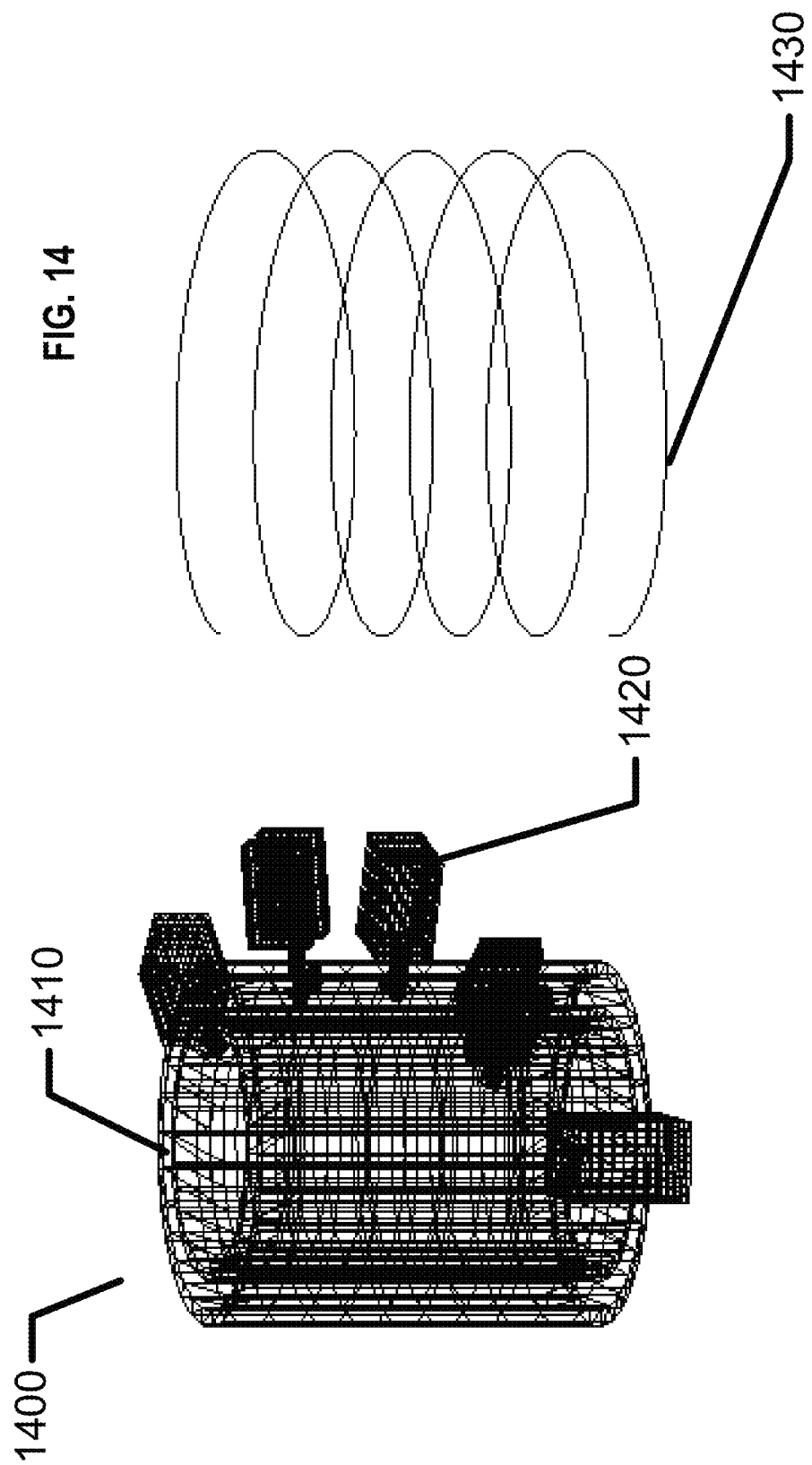
FIG. 14—An illustration of an exemplary view of a vertical round type fabricator design wherein substrates are moved along a helically shaped belt conveyor system.

In another example, the roll to roll processing or belt driven transfer may occur in a round annular shaped cleanspace fabricator where the conveyors may cycle upon themselves in a single level with a second means of transport between levels. In a specialized case, of these types of processing in a round annular shaped cleanspace (as depicted in FIG. 3C the belt may be shaped into a helical pattern which with appropriate placement of tools in a continuously varying height the helical belt may continuously pass by the tools in the fabricator. Proceeding to FIG. 14, an illustration of the helically oriented fabrication may be found. A round annular fabricator 1400 may be found with an annular cleanspace 1410 and processing tools 1420 placed around the periphery in radial fashion. The belt 1430 may proceed in a helical pattern. For illustration purposes a subset of the tools along a helical pattern are demonstrated. As well, the helical pattern 1430 is illustrated to the side to convey the nature of the belt transfer or roll to roll transfer that may occur.

Substrate with Processing Surface Transferred Between Tools

Figure 15:
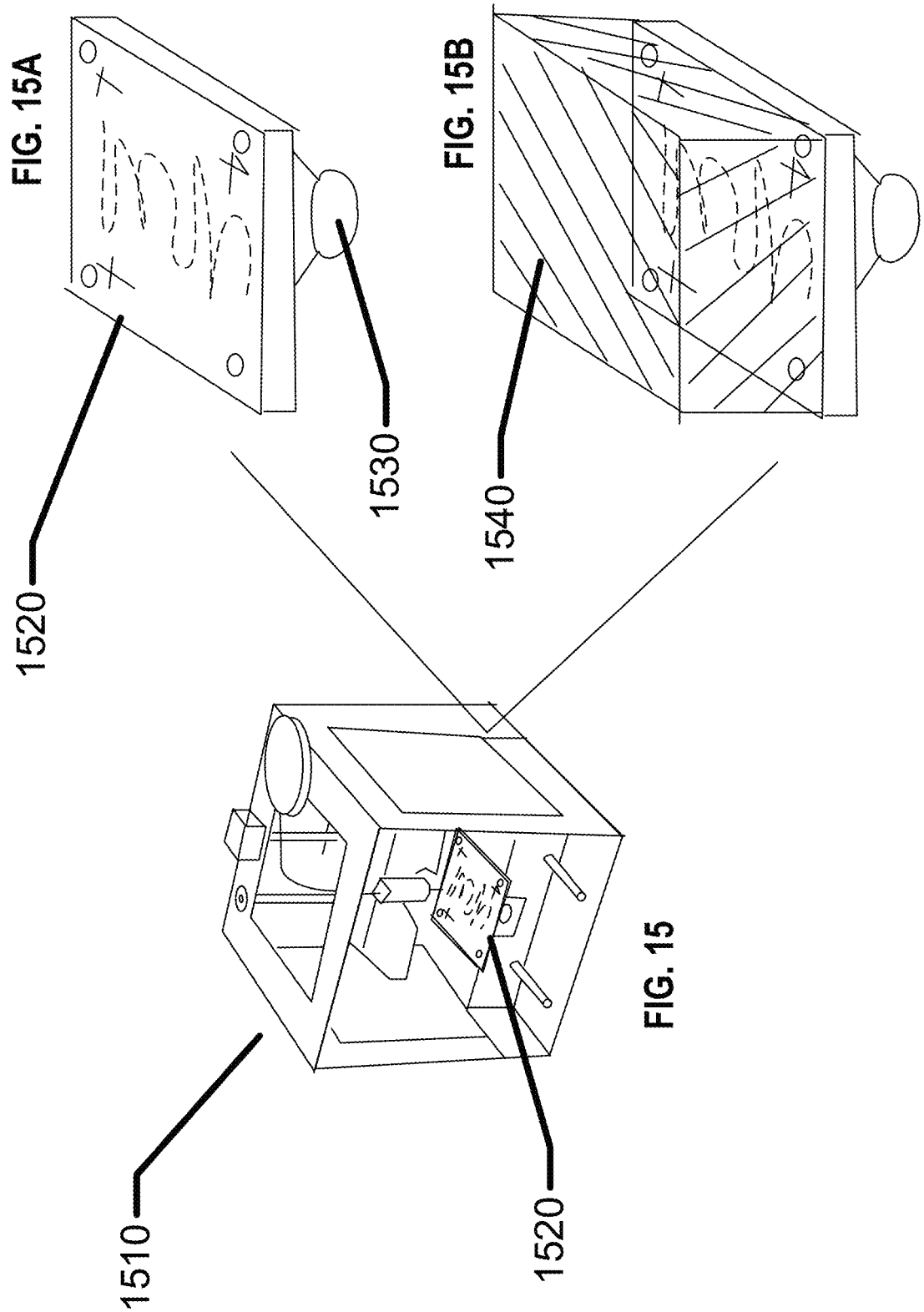

In some processing tools, a work product may exist, grow or be formed upon a surface with the tool. For example, the work stage of a 3D printer may be a heated and/or cooled plate coated with a surface coating upon which layers are deposited as the work material grows. In some examples, this work surface with a variety of functionality may be incorporated into the substrate that is passed between tools with automation. The work surface may have a sealing surface to allow a cover to be placed onto the plate to form a component that is analogous to a substrate carrier. The cover may be removable, for example in a tool port of a processing tool while the work surface passes into the tool and interfaces with the processing portions inside the tool body. Proceeding to FIG. 15, a depiction of a processing tool incorporating an exemplary 3d printing tool may be found. The work surface of the 3D printer may be a (LOOKUP) essentially a metal plate that in some examples is coated with materials such as Kapton® for adherence of the printed material as well as an ability to remove the printed object. In an example, there may be numerous types of three dimensional printers that will each perform some level of processing on the product on the substrate. One step for example may extrude thermoplastic material to form a portion of the product. A second printer may print metal features upon the product. A third printer may cover portions of the metal interconnects with an insulating material. Other processing tools may receive the substrate with work surface to attach solderable connections onto the isolated metal levels. Other tools may pick and place electronics, components, integrated circuits, touch screen elements, casing materials and the work product may be moved form process to process upon the substrate with work surface and carrier cover. Other tools may add components, adhesives, sealants and the like. Still other tools may mechanically cut, laser cut, abrade, shape or otherwise machine the work product upon the substrate. Other tools may inspect, monitor, and measure the work product. Again in FIG. 15 an example of a 3D printer 1510 with an incorporated work surface 1520 may be found. At FIG. 15A the work surface may be shown isolated from the processing tool. An attachment means 1530 may be attached to the mobile work surface which may be the substrate that is transported within the cleanspace fabricator. And, at FIG. 15B the work surface may be shown isolated from the tool but with a carrier cover 1540 thereupon to insulate the work product upon the work surface on the substrate during transport from a load port of a tool to a load port of another tool.

Methods of Utilizing Exemplary Fabricators

There may be various manners of using the various fabricators as discussed in the present disclosure to produce a product. A product may be formed by placing a substrate within the cleanspace or cleanroom type region of a hybrid type fabricator, or in the cleanspace region of the discussed cleanspace type fabricators. The substrate may be moved within the cleanspace region by automation that may move a carrier that contains the substrate from a first tool port to a second tool port. Once handed to the second tool port, the carrier may be unloaded and the substrate may be loaded into the second tool. A process may be caused to be performed upon the substrate. A combination of such steps may result in a formed product. The product may comprise regions of one or more of a semiconductor product, an integrated circuit, an assembled die form of a high technology product, a Microelectromechanical system (MEMS) product, a microfluidic type product, an energy device type product (such as a battery or a fuel cell), an optoelectronic type product, or other types of high technology products.

In some examples the method discussed above may be equivalently performed where the substrate may be replaced with a vessel of various types. A pharmaceutical or chemical product may be an example product that may be manufactured with methods that process substrates. Thus a product may be formed by placing a vessel containing a liquid or a powder within the cleanspace or cleanroom type region of a hybrid type fabricator, or in the cleanspace region of the discussed cleanspace type fabricators. The vessel may be moved within the cleanspace region by automation that may move a carrier that contains the vessel or the vessel itself from a first tool port to a second tool port. Once handed to the second tool port, the carrier or the vessel itself may be unloaded and the vessel may be loaded into the second tool. A process may be caused to be performed upon the contents of the vessel. A combination of such steps may result in a formed product.

As manufacturing lines age and as product lifecycles progress, it is possible for a cleanliness requirement for products to evolve and to require changes in the inherent aspects of production. In some cases, the changes require new replacement tooling or improved materials aspects, while in others the environment that tooling resides in needs to be upgraded. Whether the current environment is a cleanroom type of environment or not, an effect means of retrofitting the environment may be to retrofit the existing manufacturing line into a cleanspace based fabricator manufacturing line.

Figure 16:
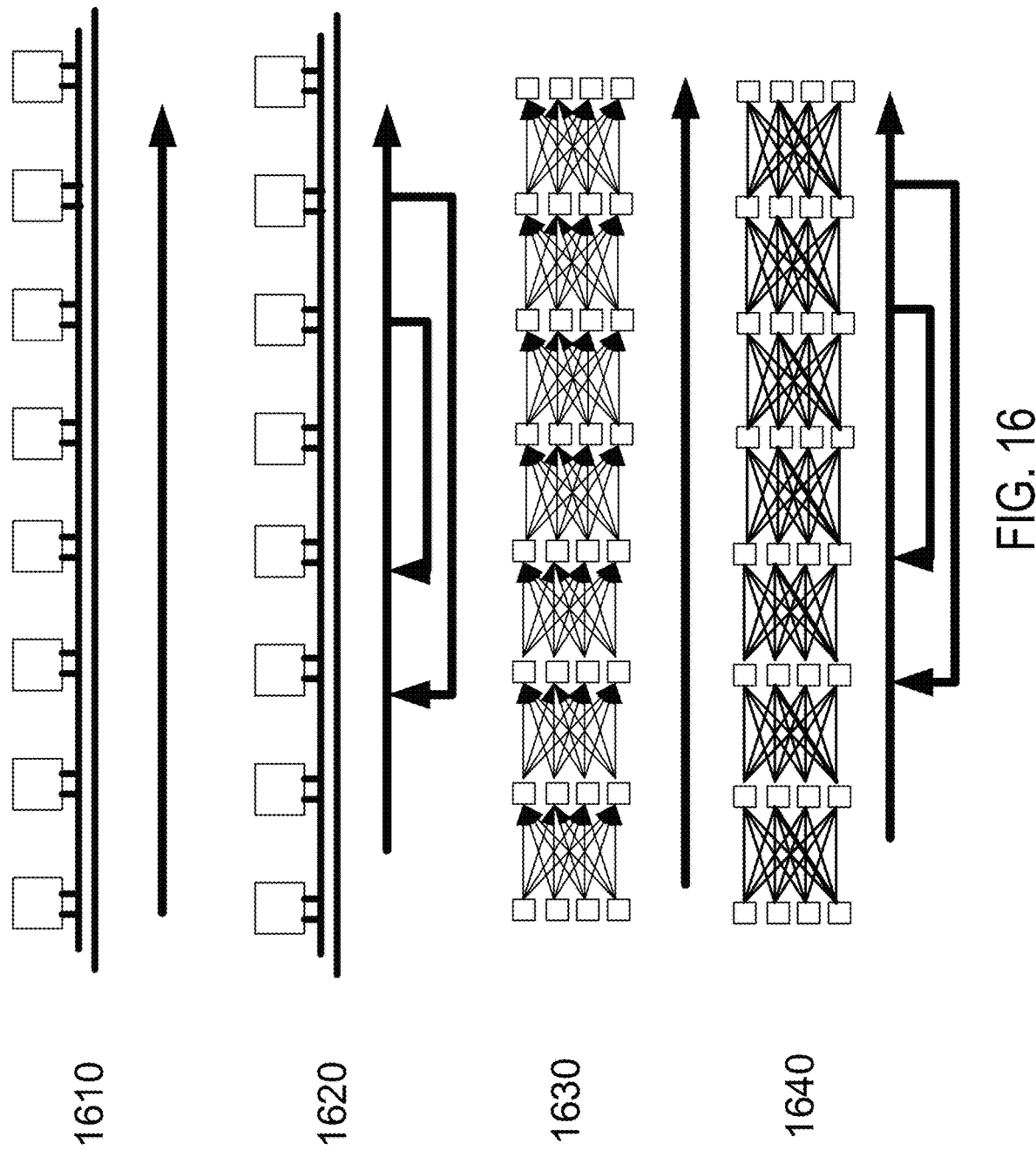
FIG. 16—Overview of exemplary types of manufacturing process flows

Proceeding to FIG. 16, item 1610 demonstrates an exemplary case for manufacturing where the processing tools are located in a serial fashion. A work product is moved from one tool to the next tool after a process is complete and then by moving the work product to the end of the processing tools a complete product is obtained.

A somewhat different condition is demonstrated by item 1620, where the processing tools are assembled in a serial fashion; however the automation and the processing flow entails the work product moving from certain tools back to tools that were previously involved in processing and perhaps forwards to tools not yet involved in processing. The characteristics of such a flow may allow for improved cost aspects for end products, but may result in much more complicated operational control and planning.

A different situation is again demonstrated as item 1630. In this type of flow there may be multiple tools of a particular tool type, or of all tool types. When a substrate proceeds to a particular tool type it may then be processed by one of a multiple number of tools of that type. This situation as well has more complicated logistics than the first example in item 1610. However, advantages in the logistical flow can be quite important. For example if one of the processing tools of a particular type is not functioning and may need to be repaired, the work flow may proceed through one of the equivalent types of tools without the significant delays that would happen in a linear processing flow with one tool at each process step.

A still further different manufacturing condition may be demonstrated by item 1640 where there are multiple tools of the various types and the processing can proceed in a haphazard manner from one tool type to another until the processing is complete. This is still higher in complexity than any of the other situations discussed. There may be numerous manners to operate a production flow of this type including for example allowing any work product to go through any of the multiple tools at a particular processing step to having dedicated tools for the processing at a particular processing step in the work product flow where use of other tools is only done under special circumstances.

Each of these types of manufacturing flows may be consistent with retrofitting to a fabricator of a cleanspace type. As an example consider the example of item 1700, FIG. 17. In this example item 1710 may represent an exemplary manufacturing line of the types shown as items 1610 and 1620. The line may have numerous tools as for example, one of them being item 1715. Furthermore, the work product may be moved from tool to tool on an automation system depicted as item 1720. In an exemplary sense, it may be necessary to retrofit this manufacturing line because it may have been determined that the environment of manufacturing line 1710 is of an insufficient cleanliness level. Item 1750, in FIG. 17, may demonstrate one of the embodiments of a cleanspace fabricator that is a possible design to retrofit the manufacturing line into. This design would have the processing tools 1755 arranged in a matrix along vertical rows extending multiple levels in a vertical direction. The design has an efficient cleanspace for the movement of substrates from tool to tool shown as item 1760. In the region of item 1760 may be located automation systems that handle substrates or in some embodiments substrates inside substrate carriers. By appropriate flow of filtered air, the region may be brought to a very good cleanliness level. Furthermore, due to the nature of the design the space used for the automation and movement may be very small; a fact that allows for efficient operations and an easier environment to treat in cases where the cleanliness needs refer both to particulate forms and biological forms.

Determining the Cause of Particulates in the Manufacturing Operation

Figure 18:
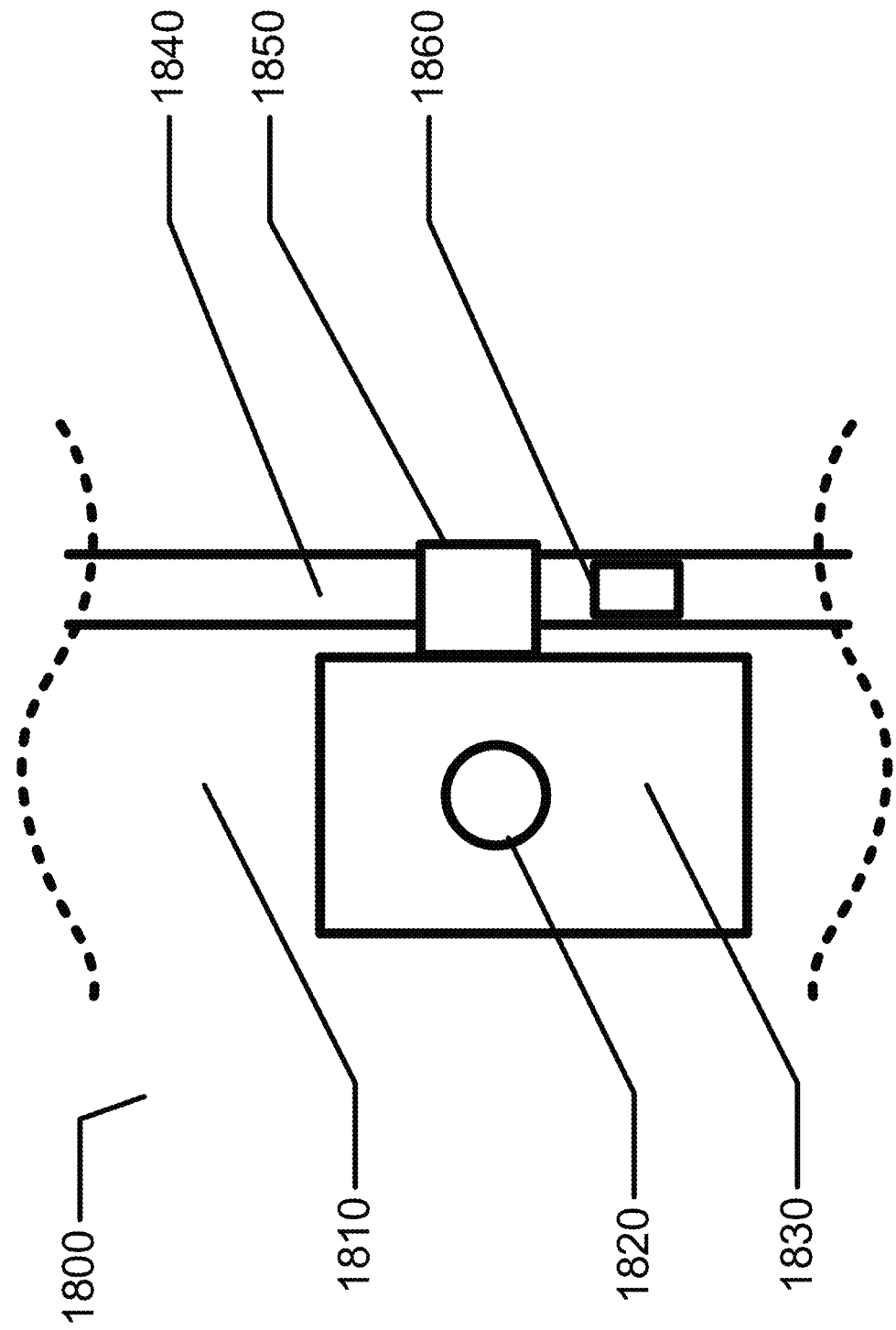
FIG. 18—An illustration of a close-up of a generic processing environment including automation to move production units FIG. 19—The figure illustrates a close-up of a generic processing environment including automation to move work in progress which has been incorporated into a cleanspace fabricator environment as existing.

Proceeding to FIG. 18, item 1800 a model of a process tool in a manufacturing line is depicted. The tool, item 1830, resides in an operating environment depicted as item 1810. In the same environment is also located the automation system used to move work in process from tools to tools, item 1840. At each of the tools in some embodiments will be a means of moving product substrates into the processing tool, an exemplary depiction of such an apparatus is shown in an exemplary manner as item 1850. In some embodiments a single substrate may move from tool to tool, in other embodiments collections of substrates will move. In either case the substrates may in some embodiments be contained in a carrier as they are moved between tool to tool. For example, such a carrier may be represented as item 1860 in FIG. 18.

When determining a course of upgrading the manufacturing line due to an increase in cleanliness requirements. One important step may involve determining the nature and source of the existing level of contamination that occurs in the current line. There may be many different sources of the contaminations that occur. Identifying and segregating those sources are key in determining the full nature of retrofitting needed. For example if the entire source of contamination were determined to be the environment alone, then installation of the facility into a cleanspace or cleanroom may result in an acceptable product characteristic.

Some of the likely sources to partition out may include for example, 1820 the processing environment (s) of the production process. Each of these tool processing environments may inherently be contributing contaminants to the product. In this case, a change of the operating environment cleanliness may not be sufficient to yield an acceptable end result in its own right. Work would need to be performed to understand if the processing conditions and materials and the nature of the processing environments could be improved in straight forward manners or whether an entire new set of tools will also be required in addition to environment.

The automation components, like items 1840, 1850 and 1860 may also be a major source of contamination. The system that moves carriers or substrates between tools, item 1840 may generate significant levels of contamination. Or the equipment to move the carriers or substrates into the processing tool, item 1850, may be a source of contaminant. Or, the container that carries the substrates or is the substrates may be a source of contaminants, item 1860. In cases where the automation components add significant major source of contamination it may be possible that a retrofit to a cleanspace fabricator environment may offer an alternative means of moving substrates from tool to tool that may be attractive when compared to upgrading the existing automation equipment and materials solutions for improved cleanliness.

Except when the environment, 310, is determined to not add contaminants to the product and a "cleaner" environment is not needed, a cleanspace based fabricator may represent an ideal infrastructure as part of the solution of retrofitting manufacturing lines. In addition to being a solution that is clean, it will also be a much more compact, lower operational cost solution with lower infrastructure cost immediately as well. Furthermore, a cleanspace fabricator has the unique property where substantially all the tools exist on the periphery of the fabricator cleanspace. This provides operational advantages for a fab that may be particularly significant for smaller sized tooling.

In the following sections, description will be given to those cases where an upgrade to the environment is required. Some, exemplary solutions to the particular cases will be described with description of some embodiments of the cleanspace fabricator type. It may be apparent to one skilled in the arts, that the diversity of solutions within the various types of embodiments of cleanspace fabricators are within the scope of the inventive art herein, and are broadly included as additional alternatives.

Embodiments where Automation Exists and is Clean

Figure 19:
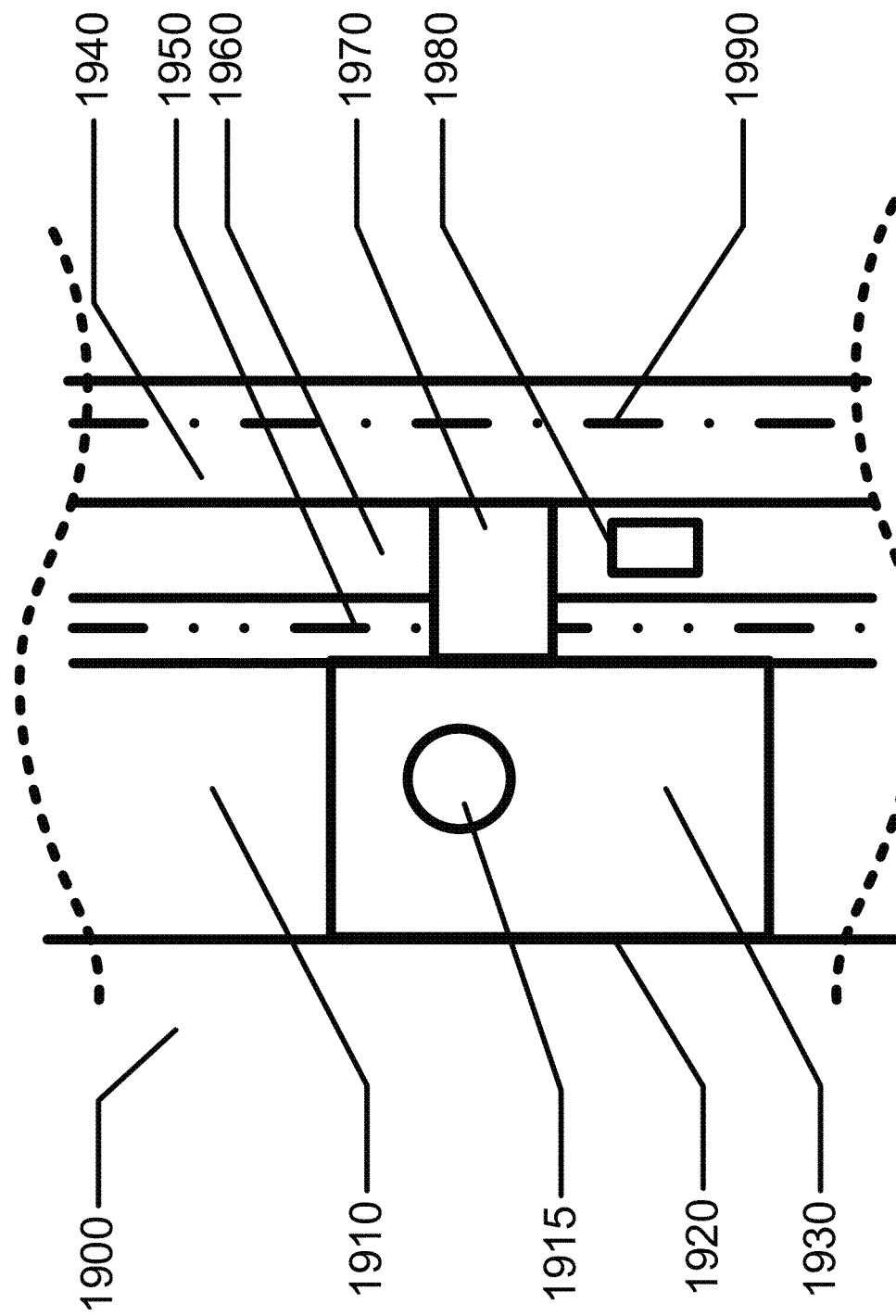

In the case where the automation that is currently employed in a manufacturing line is sufficiently "clean" in its own right then the existing fabricator system may be included into a cleanspace fabricator in some straightforward manners. Inherently in many of these embodiments, the contamination performance of the tooling and the substrate carrier components will also be adequate for the new requirements. In such cases, and proceeding to FIG. 19, item 1900 a description of how the existing tooling and automation may be incorporated into a cleanspace fabricator is shown. The depiction is a cutout view of a single tool with its automation which has now been included into a cleanspace fabricator type. Item 1920 demonstrates the inclusion of a cleanspace wall or boundary on the "outside" of the process tool, item 1930. On the other side, or "inside" of the process tool another cleanspace boundary, item 1950 is included. The presence of these two boundaries creates a cleanspace, item 1910. This cleanspace would be classified in typical embodiments as a secondary cleanspace that contains the bodies of the tools within it.

The cleanspace boundary, 1950 is depicted with a dashed line. In some embodiments a flow of air will be directed through the wall or through HEPA filters mounted on the wall across a primary cleanspace 1940, which involves the transport of carriers or substrates from tool to tool. The airflow will continue to a second air receiving wall or boundary of the primary cleanspace labeled as item 1990. This architecture allows for a very high level of cleanliness to be defined and maintained where the substrates are moving from tool to tool.

Also, at least partially within the primary cleanspace 1940, may be located the tool port, item 1970 which is used to move carriers or substrates into the internal spaces of the tool body, 1930. The carriers or substrates, item 1980, may move along an automation system, item 1960 from tool ports to tool ports. A processing region 1915 may be included. In some embodiments where the existing automation system is incorporated into the cleanspace fabricator, the movement from a tool port to a tool port may occur only in a fixed horizontal direction.

Figure 20:
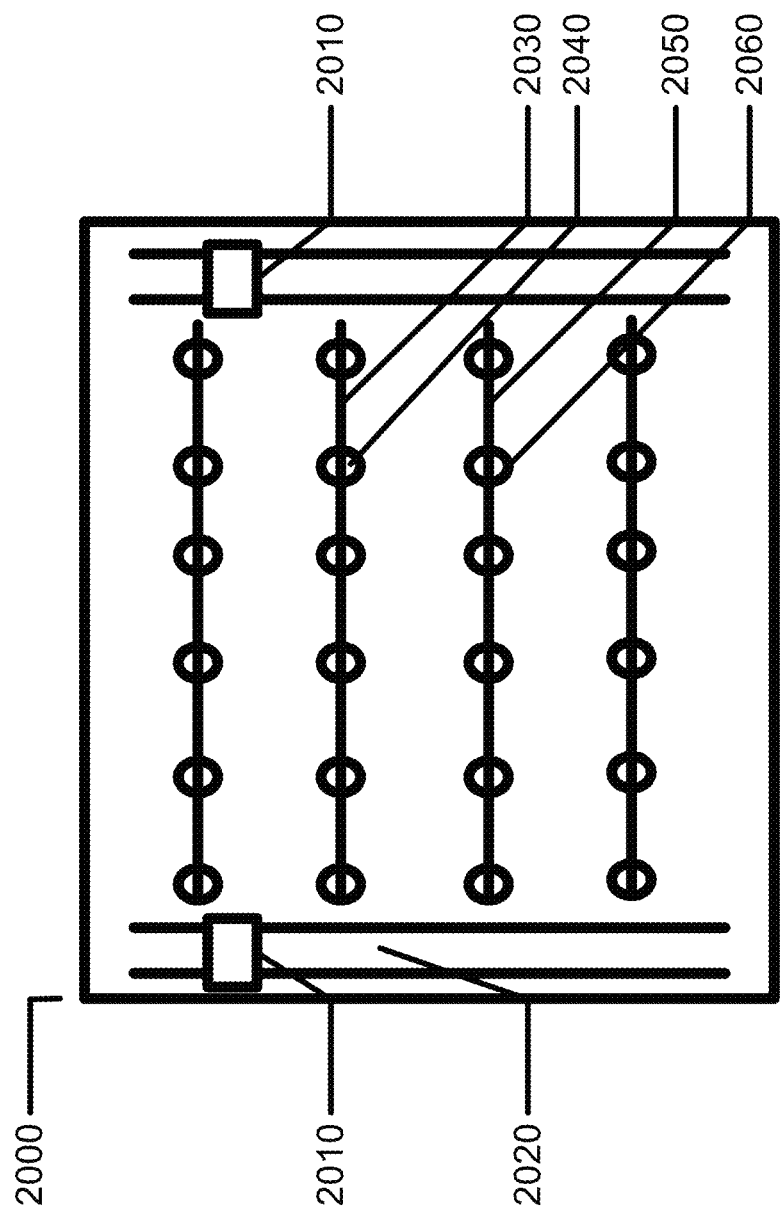
FIG. 20—The figure illustrates an exemplary incorporation of existing processing lines into a cleanspace environment with automation between levels.

Proceeding to FIG. 20, item 2000, a depiction of the deployment of processing tools into the cleanspace fabricator is shown in cross section. In some embodiments where the automation is incorporated in its existing form it may have horizontally deployed automation. The automation may be broken down into segments the length of the cleanspace as depicted by items 2030 and 2050. Since the processing may proceed along the horizontally deployed levels. The substrates or carriers may move along the horizontal automation systems and to a tool port for example as shown by item 2040. As the processing proceeds the substrate or carrier may need to move from level 2030 to level 2050 for example. In some embodiments there may be an automation system that allows for the movement between levels. Examples of such intra-level automation may be depicted by the automation units identified as items 2010. There may be numerous manners to move substrates or carriers between levels, and in one embodiment type the automation units may move along vertical rail systems shown by item 2020. If the substrate or carrier is moved from level 2030 to 2050, it may next be moved along the horizontal automation of item 2050 to the toolport 2060. It may be apparent to those skilled in the art that there may be numerous designs of existing manufacturing lines and automation systems and the embodiments depicted may be modified to accommodate various changes as for example there may be multiple levels to the automation or it may not be linear or other such changes. The various changes of cleanspace fabricator design to accommodate various existing line designs are intended to be within the scope of the inventive art herein.

Embodiments where Automation Contributes Significantly to Contamination

In some circumstances, analysis of the existing manufacturing line may reveal that the automation equipment contributes contamination to the environment in significant levels. In some of these cases then the placement of the manufacturing line and automation into a cleanspace may not be sufficient to result in an acceptable end product due to the contamination. The general nature of a cleanspace fabricator allows for embodiments that effectively solve this need.

Figure 21:
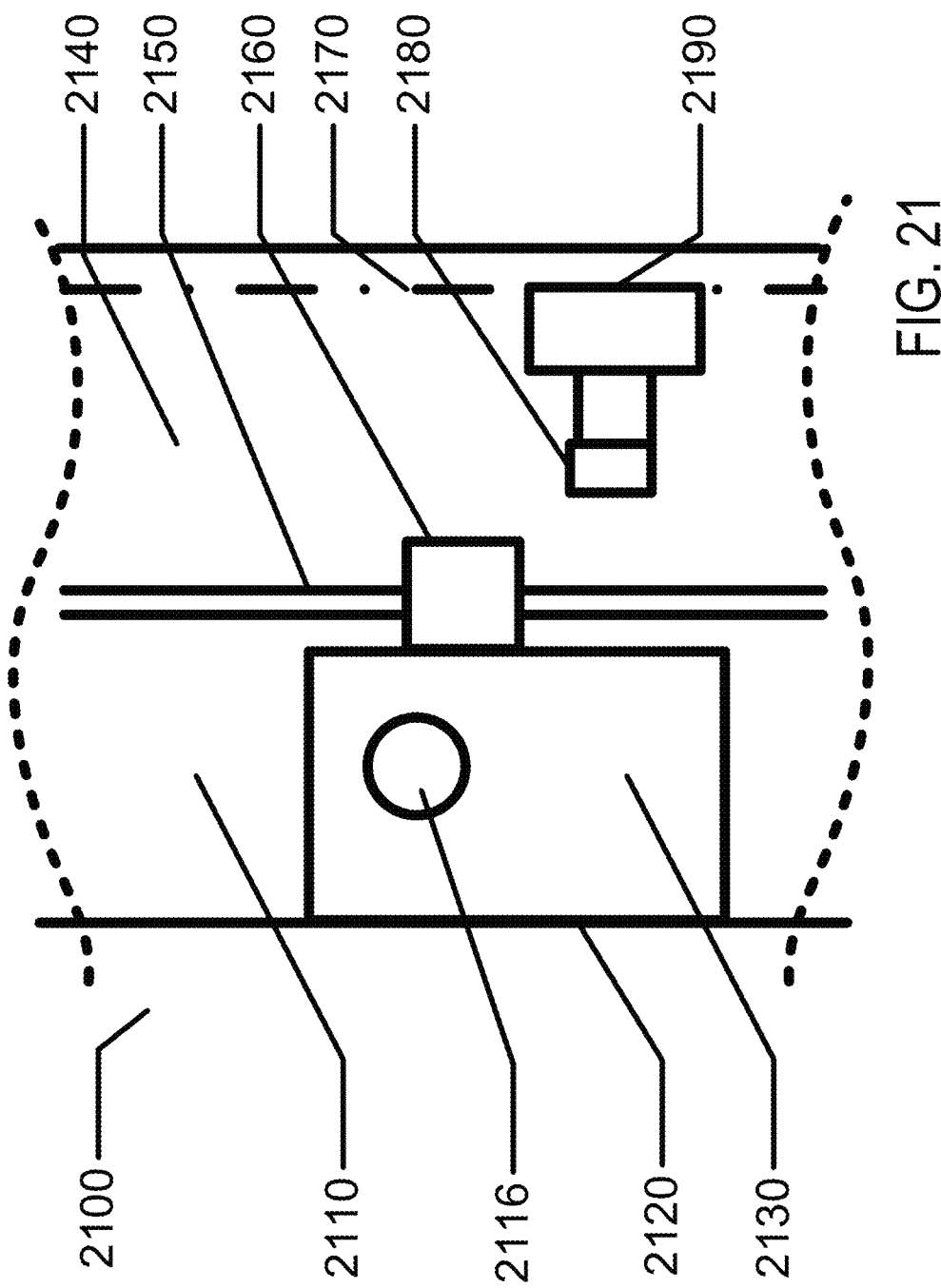
FIG. 21—The Figure illustrates a close-up of a generic processing environment including automation to move production units where the automation is made new in the cleanspace environment.

Proceeding to FIG. 21, item 2100, a depiction of incorporating existing process tools into cleanspace fabricators is made. The automation system of the line, in some embodiments may be replaced with a fab-wide automation system as some cleanspace embodiments may have. As shown a process tool, item 2130, may be located in a secondary cleanspace, 2110, that may be located between exterior walls as for example item 620 may represent and an interior wall as 2150 may represent. In some embodiments, the airflow may proceed in the primary cleanspace 2140 from wall 2150, which would then be an air source wall, to wall 2170, which would then be an air receiving wall. In some embodiments the airflow may be characterized as a laminar flow, or in others as a uni-directional flow and in still others as a non uni-directional flow. The air may flow out of penetrations in the wall itself (In the case of the air source wall). Or, in alternatives there may be HEPA filters as part of the wall or the wall itself and the air flow may come out of the HEPA filter as it proceeds across the primary cleanspace, 640.

Referring again to FIG. 21, item 2100, the fab automation system may be represented as item 2190. In some embodiments the automation system may be attached to the back wall, item 2170; however, numerous alternative embodiments may be possible including as a non-limiting example, the automation system being attached to the top of the multilayer cleanspace. The automation will move a substrate or in some embodiments a carrier that contains one or more substrates, item 2180, to a tool port, item 2160 which is capable of receiving the substrate or carrier and move the substrate to within tool body, 2130. After processing the tool body may be moved out of the tool port 2160 and back to the automation system. It may be apparent that numerous alternatives to this may occur, including for example that there may be multiple ports connected to a tool body where in some embodiments one port would act to receive substrates for the tool and the other would act to discharge substrates.

Figure 22:
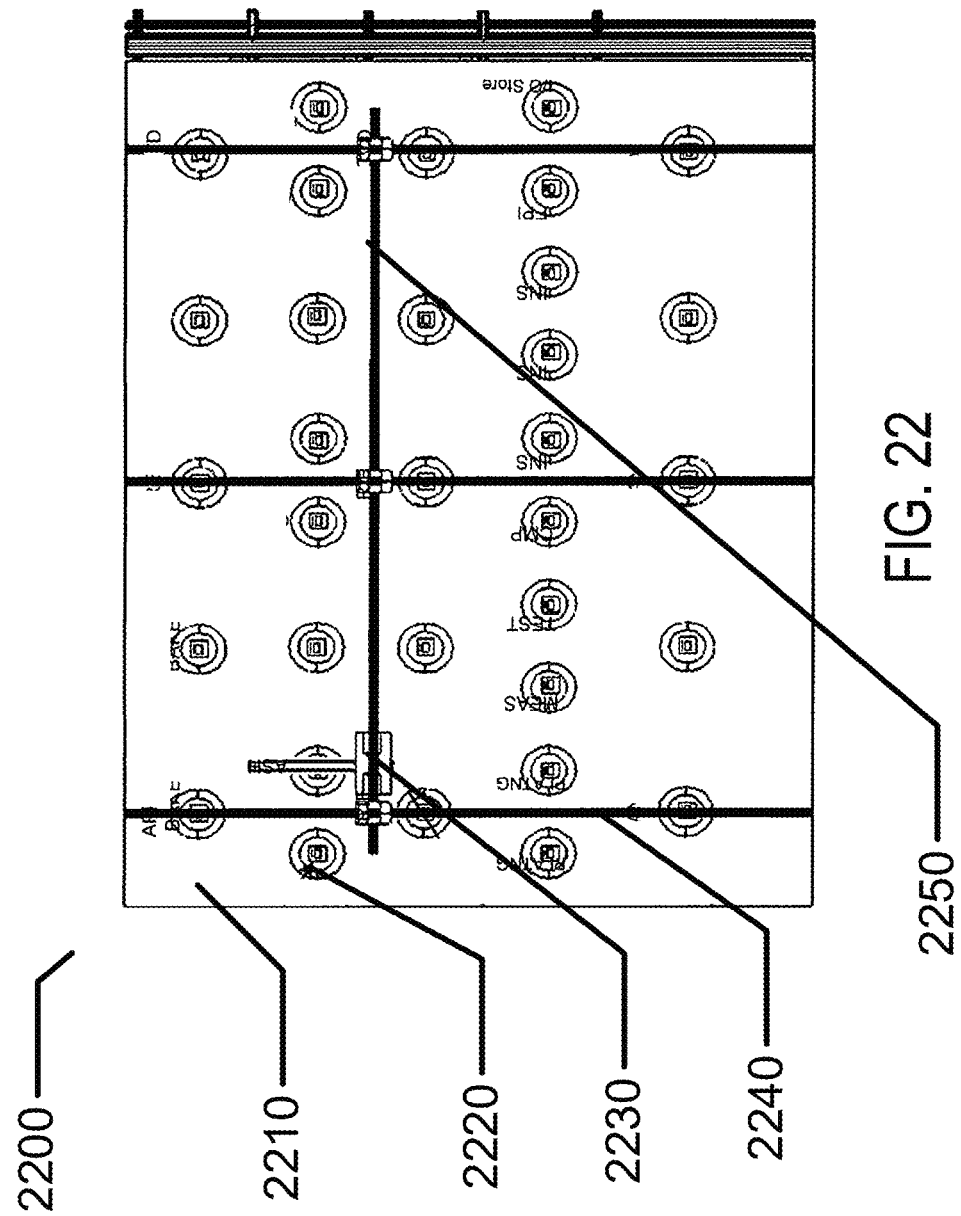
FIG. 22—The figure illustrates an exemplary tooling layout in a cleanspace environment along with the new cleanspace environment automation to move from tool to tool.

Referring to FIG. 22, item 2200, a depiction of the inside of the primary cleanspace of FIG. 21 while looking at wall 2150, which in this drawing is now represented in plan view as item 2210, may be observed. Multiple tool ports may be represented as the round shaped features, as an example item 2220. In this perspective view the automation may, in a non-limiting example embodiment, consist of linear rails that allow movement along a vertical dimension, item 2240, for example and along a horizontal dimension, item 2250. The automation handler that receives carriers or substrates may be identified as item 2230. It may be noticed in this example that since the automation is able to address any tool port by a direct movement from a first tool port that the layout of the tool bodies and the associated location of the tool ports may be less structured as compared to previous examples. As may be apparent, there may be numerous manners to deploy tools and handle substrates within the primary cleanspace that would be consistent with the art herein.

Referring back to FIG. 21, item 2100 the tool 2130 may have schematically represented as item 2116 a processing environment where substrates may have processes performed upon or to them. In some circumstances, an original tool from an existing manufacturing line may have a processing environment, 2116, where particulates are significantly added to substrates being processed within. This may be for a number of reasons including material aspects of the processor design or other aspects of the processor design that generate or free particulates to interact with the substrate under processing. In this case, in some embodiments, this condition may cause a special case for the incorporation of manufacturing lines into cleanspaces. In some cases, just one tool may have the issue in question and it may be rebuilt or redesigned before being located in a cleanspace fabricator.

In other embodiments, it may be desirable to regenerate all of the tooling that is used in the existing manufacturing line. There may be numerous methods to perform this regeneration ranging from rebuilding the processing, automation, control or "toolport" regions of the tool to redesigning the materials or component aspects within the processing tool. In some embodiments, it may be desirable to redesign the entire tool itself. In such cases, the design choices may include tradeoffs that incorporate aspects that improve the efficiency of a cleanspace fabricator. If the tools can be made small to process the substrate, then the incorporation of the tool pod and tool chassis aspect of some embodiments of a cleanspace fabricator may allow for the leverage of reversibly placing and removing tool bodies through the peripheral wall of the fabricator. As mentioned in prior descriptions some of which have been incorporated by reference herein, small replaceable tools may allow for efficiency of operation and the ability of a fabricator to operate with minimal staffing requirements since tools may be repaired off line or at remote locations, but the fabricator can be made operational by the placement of a functioning copy of the tool. Another advantage of smaller tools may be that there can be more units of them economically placed in the new cleanspace fabricator. As was described in item 1640, FIG. 16, the multiple tools that may be flexibly used in a manufacturing flow may allow for advantages from a manufacturing perspective. Multiple paths may improve the cycle times of production and flexibility of the manufacturing processing as well for example. There may be numerous manners to incorporate a new tool design and optimize the aspect of its placement into a cleanspace fabricator for the function of performing existing manufacturing steps or perhaps improved manufacturing steps.

Figure 23:
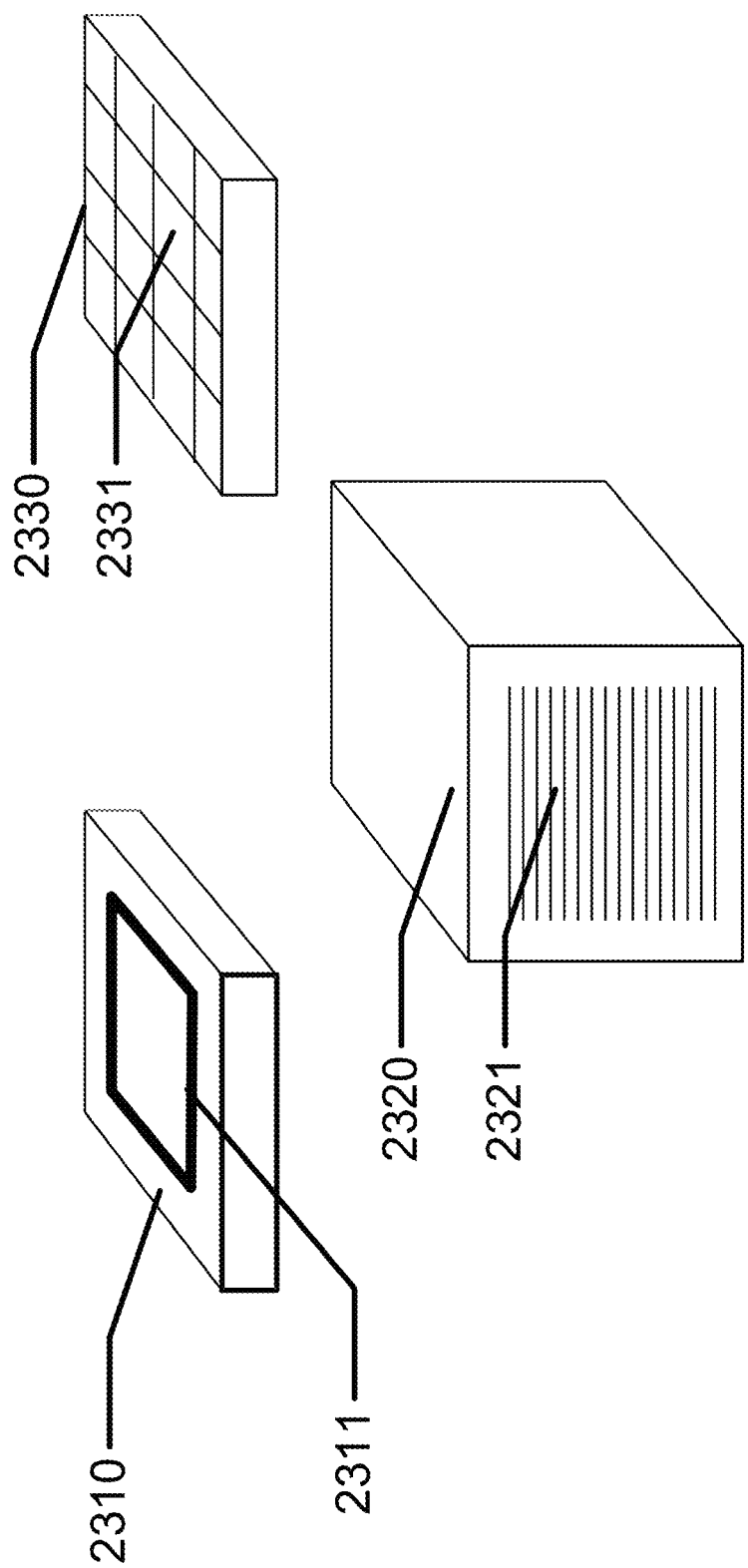
FIG. 23—The Figure illustrates different exemplary types of substrate carriers.

Proceeding to FIG. 23, there have been numerous mentions of the fact that the cleanspace fabricator and the automation within it may handle substrates or carriers that contain a substrate or multiple substrates. Item 2310 may be intended to depict a carrier that contains a single substrate, item 2311. These substrates may be of various types of shapes as wafers which are typically round to squares as depicted in the figure to other shapes.

Item 2320 depicts a carrier that may contain numerous substrates, 2321, within it. The same diversity of shapes and materials may comprise acceptable types of carriers. The carrier itself may be capable of supporting a protected clean environment within its boundaries. In a non-limiting exemplary sense, when the carrier is containing semiconductor wafers, some of these carriers may include SMIF or FOUP type carriers. However, any carrier capable of containing substrates and being handled by automation in the manners previously described would constitute acceptable embodiments of the art herein.

Sometimes the substrates may be contained within a carrier where the substrates are located next to each other. Item 2331 may represent one exemplary substrate contained in such a carrier 2330. These individual cells or wells may contain various shapes and materials as substrates. Here too, in some embodiments, the carrier may be able to maintain a clean environment around the substrates as they are transported. Still further diversity may come from the fact that the entire item 2330 may be considered a substrate where the multiple wells will be processed with processing tools to form a product or products within the wells, 2331, of the substrate 2330.

Examples in the previous descriptions have discussed the concepts of cleanspace fabricators. There are cases where fabricators may be formed in analogous manners where the region that is used to transport workproduct from processing tool to processing tool is not a cleanspace. In these cases, the transport region may be referred to as a workproduct transfer region. In this sense there are some examples where the workproduct transfer region is a cleanspace and some where it is not.

Figure 24:
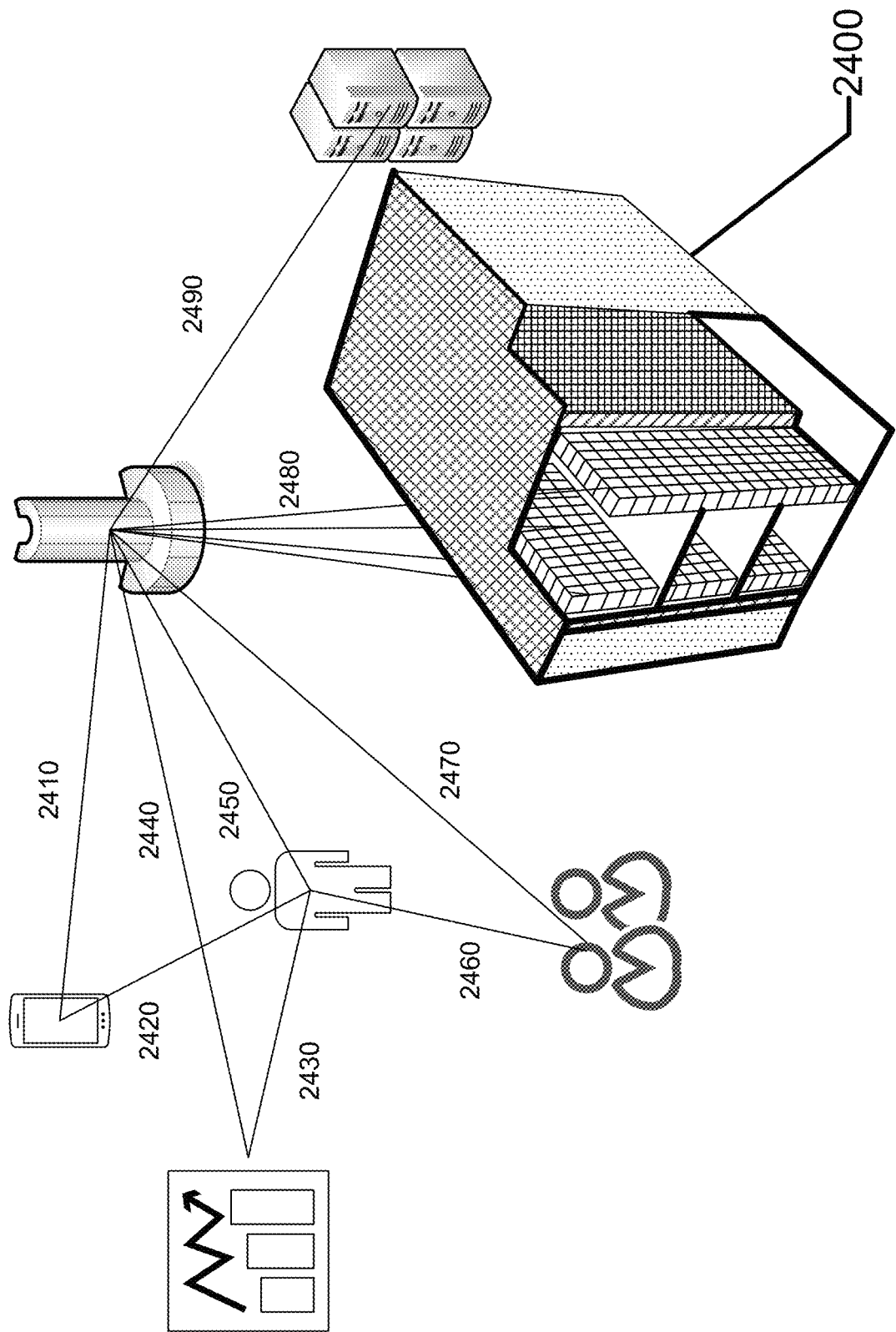
FIG. 24—The Figure illustrates an organizational diagram for a fabricator with support of a cognitive computing solution.

These aspects of an exemplary fabrication environment may form an exemplary base to describe a combination of a fabricator with a cognitive computing system. Referring to FIG. 24 an exemplary depiction of a cognitive factory may be found. A cognitive factory may be characterized as a factory with multiple automated tool nodes that have ability to flow information and data electronically to and from their nodes. The exemplary factory 2400 may have a couple hundred tools deployed for a production purpose, where the tools are small tools capable of easy reversible removability. The tools may interface with the fabricator through a tool pod and tool chassis formalism and data may be transmitted in a "hard wired" or connected manner or by wireless means. Various types of tools may be present and the tools may have various types of sensing along with individual data processing systems. In some advanced examples, the data processing systems may themselves consist or comprise cognitive processing hardware or chips. These individual nodes may communicate 2480 with a cognitive computing node.

In some examples, the fabricators will have collections of tools combined into separate cognitive nodes for control and processing and optimization. These separate cognitive nodes may communicate 2490 with a cognitive computing node for the fabricator system and environment. The cognitive nodes may include standard computing hardware that perform algorithms for cognitive processing. In other examples, some or all of the computing hardware may comprise alternative design topology such as in a non-limiting perspective neuromorphic parallel processors, cognitive synaptic computing circuits which may comprise electronic neurons, artificial neural networks or electronic circuits modelled on biological neurons.

There may be stakeholders such as employees, owners and the like that communicate 2450 with a cognitive computing node. There may be numerous types of communication relating to cognitive computing. In some examples, stakeholder may utilize question and answer formalisms to pose various queries to the cognitive nodes. In a non-limiting sense the questions may related to business aspects of operations, to financial aspects, to materials control aspects, to operational aspects, to product flow, to product quality, to delivery and order realization aspects, to technology aspects, to processing results, to product specification compliance and a host of other such aspects of the system. The stakeholders may themselves provide information of various kinds to the cognitive system.

There may be external parties that communicate 2460 with the stakeholders or with the cognitive node 2470. These parties may comprise a node in the cognitive system and interaction of various types similar to the stakeholder interactions or in some examples in supplementary manners.

There may be various data systems comprising financial, operational data and the like that are used to communicate at 2430 with stakeholders or may be directly accessed by the cognitive processing node. There may be various communication systems, including mobile based communication systems that communicate 2410 with the cognitive node and are in communication 2420 access with stakeholders. There may be numerous other nodes not depicted that are typical inputs into cognitive computing systems, but the identified nodes may form a good basis for understanding some of the basics of cognitive factories.

Figure 25:
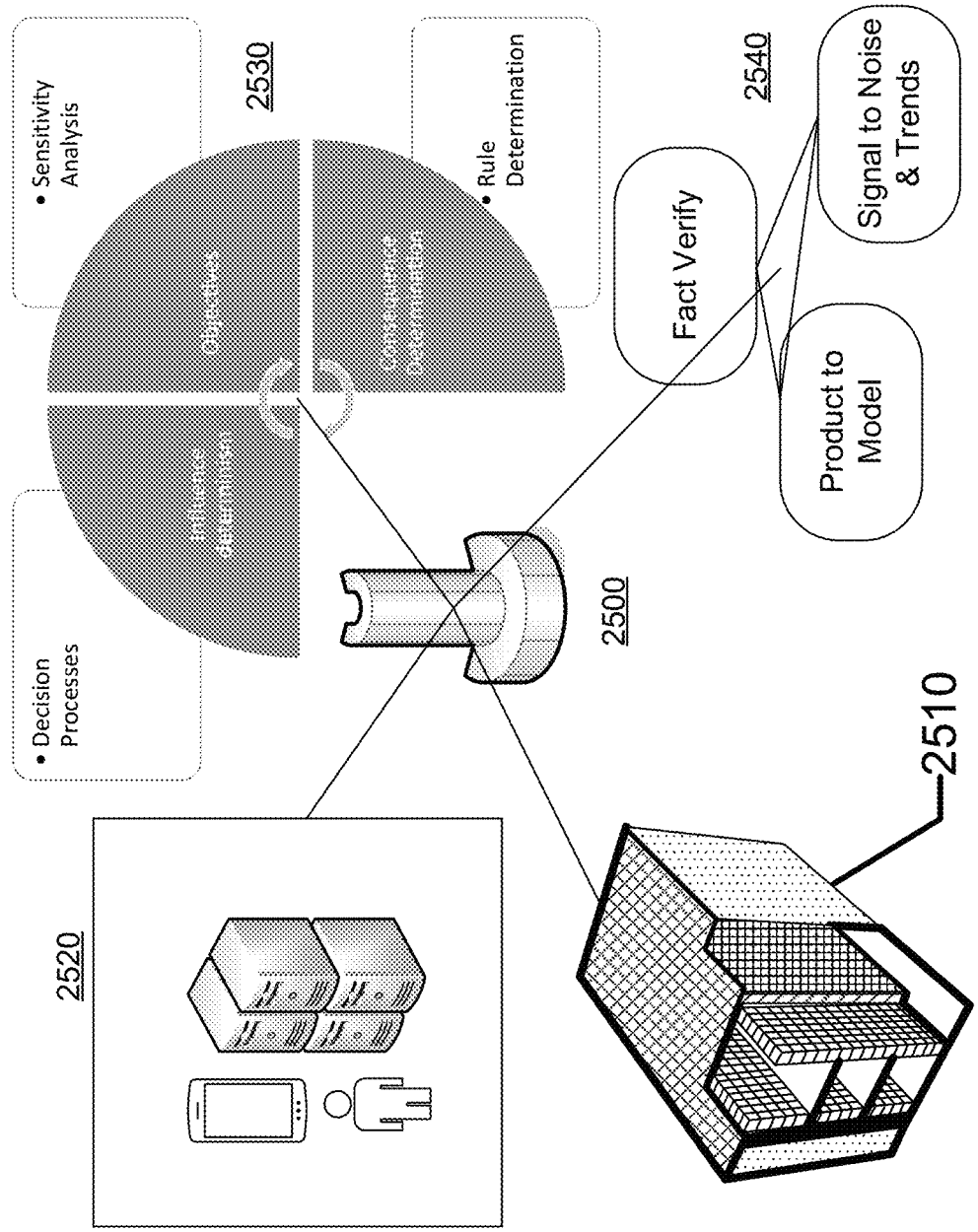
FIG. 25—The Figure illustrates the high level processing aspects, connections and architectural aspects of innately connected cognitive factories.

Referring to FIG. 25, a high level summary of aspects that may be involved in the function of a cognitive factory system may be outlined. In some examples, a cognitive node 2500 may interact with a fabricator element 2510 and have various external and internal data and communication sources 2520. The cognitive system may execute computer code that may be designed to process, analyze, detect trends and perform other cognitive functions. The systems may have functionalities 2530 that evaluate, use or produce aspects of determining decision processes, sensitivity analysis, rule determination and the like, In addition there may be determination of consequences, objectives and influence aspects. Control aspects 2540 of the system may operate in feedback nodes to perform such functionalities as verifying facts, evaluating product results to modelled results, evaluating what results are inherently related to real signals and which are noise as well as detecting trends.

The cognitive system may perform the exemplary functions and have the exemplary structure or may have other structure and functionalities. In general the cognitive system may operate to render new needs and problems accessible to computing. It may be capable of function in complex situations which may be uncertain or difficult to understand. The cognitive infrastructure may function well with high levels of information and high levels of dynamism where data and information may not have clear non-conflicting characteristics. The cognitive system may function to solve questions and problems and then learn from these solutions or answers in manners that support future function. The cognitive systems may be able to form contextual understanding of the physical trends in processing, tooling, and the complex interaction of the numerous examples of variability that may occur in complex processing. Cognitive systems may run abundant simulations to find trends and other important aspects. The cognitive systems may be interactive with various types of nodes including people, tools, data systems and the like. The cognitive systems may be adaptive, iterative, stateful and contextual.

Glossary of Selected Terms

Reference may have been made to different aspects of some preferred embodiments of the invention, examples of which are illustrated in the accompanying drawings. A Glossary of Selected Terms is included now at the end of this Detailed Description.

Air receiving wall: a boundary wall of a cleanspace that receives air flow from the cleanspace.

Air source wall: a boundary wall of a cleanspace that is a source of clean airflow into the cleanspace.

Annular: The space defined by the bounding of an area between two closed shapes one of which is internal to the other.

Automation: The techniques and equipment used to achieve automatic operation, control or transportation.

Ballroom: A large open cleanroom space devoid in large part of support beams and walls wherein tools, equipment, operators and production materials reside.

Batches: A collection of multiple substrates or vessels to be handled or processed together as an entity Boundaries: A border or limit between two distinct spaces—in most cases herein as between two regions with different air particulate cleanliness levels.

Circular: A shape that is or nearly approximates a circle.

Clean: A state of being free from dirt, stain, or impurities—in most cases herein referring to the state of low airborne levels of particulate matter and gaseous forms of contamination.

Cleanspace (or equivalently Clean Space): A volume of air, separated by boundaries from ambient air spaces, that is clean.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Conductive Connection: a joining of two entities which are capable of conducting electrical current with the resulting characteristics of metallic or semiconductive or relatively low resistivity materials.

Conductive Contact: a location on an electrical device or package having the function of providing a Conductive Surface to which a Conductive Connection may be made with another device, wire or electrically conductive entity.

Conductive Surface: a surface region capable of forming a conductive connection through which electrical current flow may occur consistent with the nature of a conductive connection.

Core: A segmented region of a standard cleanroom that is maintained at a different clean level. A typical use of a core is for locating the processing tools.

Ducting: Enclosed passages or channels for conveying a substance, especially a liquid or gas—typically herein for the conveyance of air.

Envelope: An enclosing structure typically forming an outer boundary of a cleanspace.

Fab (or fabricator): An entity made up of tools, facilities and a cleanspace that is used to process substrates or vessels.

Fit up: The process of installing into a new clean room the processing tools and automation it is designed to contain.

Flange: A protruding rim, edge, rib, or collar, used to strengthen an object, hold it in place, or attach it to another object. Typically herein, also to seal the region around the attachment.

Folding: A process of adding or changing curvature.

HEPA: An acronym standing for high-efficiency particulate air. Used to define the type of filtration systems used to clean air.

Horizontal: A direction that is, or is close to being, perpendicular to the direction of gravitational force.

Job: A collection of substrates or vessels or a single substrate that is identified as a processing unit in a fab. This unit being relevant to transportation from one processing tool to another.

Logistics: A name for the general steps involved in transporting a job from one processing step to the next. Logistics can also encompass defining the correct tooling to perform a processing step and the scheduling of a processing step.

Maintenance Process: A series of steps that constitute the repair or retrofit of a tool or a toolPod. The steps may include aspects of disassembly, assembly, calibration, component replacement or repair, component interalignment, or other such actions which restore, improve or insure the continued operation of a tool or a toolPod Multifaced: A shape having multiple faces or edges.

Nonsegmented Space: A space enclosed within a continuous external boundary, where any point on the external boundary can be connected by a straight line to any other point on the external boundary and such connecting line would not need to cross the external boundary defining the space.

Perforated: Having holes or penetrations through a surface region. Herein, said penetrations allowing air to flow through the surface.

Peripheral: Of, or relating to, a periphery.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Planar: Having a shape approximating the characteristics of a plane.

Plane: A surface containing all the straight lines that connect any two points on it.

Polygonal: Having the shape of a closed figure bounded by three or more line segments Process: A series of operations performed in the making or treatment of a product—herein primarily on the performing of said operations on substrates or vessels.

Processing Chamber (or Chamber or Process Chamber): a region of a tool where a substrate resides or is contained within when it is receiving a process step or a portion of a process step that acts upon the substrate. Other parts of a tool may perform support, logistic or control functions to or on a processing chamber.

Process Flow: The order and nature of combination of multiple process steps that occur from one tool to at least a second tool. There may be consolidations that occur in the definition of the process steps that still constitute a process flow as for example in a single tool performing its operation on a substrate there may be numerous steps that occur on the substrate. In some cases these numerous steps may be called process steps in other cases the combination of all the steps in a single tool that occur in one single ordered flow may be considered a single process. In the second case, a flow that moves from a process in a first tool to a process in a second tool may be a two-step process flow.

Production unit: An element of a process that is acted on by processing tools to produce products. In some cleanspace fabricators this may include carriers and/or substrates or vessels.

Robot: A machine or device that operates automatically or by remote control, whose function is typically to perform the operations that move a job between tools, or that handle substrates or vessels within a tool.

Round: Any closed shape of continuous curvature.

Substrates: A body or base layer, forming a product, that supports itself and the result of processes performed on it.

Tool: A manufacturing entity designed to perform a processing step or multiple different processing steps. A tool can have the capability of interfacing with automation for handling jobs of substrates or vessels. A tool can also have single or multiple integrated chambers or processing regions. A tool can interface to facilities support as necessary and can incorporate the necessary systems for controlling its processes.

Tool Body: That portion of a tool other than the portion forming its port.

Tool Chassis (or Chassis): An entity of equipment whose prime function is to mate, connect and/or interact with a toolPod. The interaction may include the supply of various utilities to the toolPod, the communication of various types of signals, the provision of power sources. In some embodiments a Tool Chassis may support, mate or interact with an intermediate piece of equipment such as a pumping system which may then mate, support, connect or interact with a toolPod. A prime function of a Tool Chassis may be to support easy removal and replacement of toolPods and/or intermediate equipment with toolPods.

ToolPod (or tool Pod or Tool Pod or similar variants): A form of a tool wherein the tool exists within a container that may be easily handled. The toolPod may have both a Tool Body and also an attached Tool Port and the Tool Port may be attached outside the container or be contiguous to the tool container. The container may contain a small clean space region for the tool body and internal components of a tool Port. The toolPod may contain the necessary infrastructure to mate, connect and interact with a Tool Chassis. The toolPod may be easily transported for reversible removal from interaction with a primary clean space environment.

Tool Port: That portion of a tool forming a point of exit or entry for jobs to be processed by the tool. Thus the port provides an interface to any job-handling automation of the tool.

Tubular: Having a shape that can be described as any closed figure projected along its perpendicular and hollowed out to some extent.

Unidirectional: Describing a flow which has a tendency to proceed generally along a particular direction albeit not exclusively in a straight path. In clean airflow, the unidirectional characteristic is important to ensuring particulate matter is moved out of the cleanspace.

Unobstructed removability: refers to geometric properties, of fabs constructed in accordance with the present invention that provide for a relatively unobstructed path by which a tool can be removed or installed.

Utilities: A broad term covering the entities created or used to support fabrication environments or their tooling, but not the processing tooling or processing space itself. This includes electricity, gasses, airflows, chemicals (and other bulk materials) and environmental controls (e.g., temperature).

Vertical: A direction that is, or is close to being, parallel to the direction of gravitational force.

Vertically Deployed Automation Space: a space whose major dimensions of span may fit into a plane or a bended plane whose normal has a component in a horizontal direction. A Vertically Deployed Automation Space may have an automation tooling that transports material in at least a vertical direction between multiple levels of tools.

Vertically Deployed Cleanspace: a cleanspace whose major dimensions of span may fit into a plane or a bended plane whose normal has a component in a horizontal direction. A Vertically Deployed Cleanspace may have a cleanspace airflow with a major component in a horizontal direction. A Ballroom Cleanroom would typically not have the characteristics of a vertically deployed cleanspace.

While the invention has been described in conjunction with specific embodiments, it is evident that many alternatives, modifications and variations will be apparent to those skilled in the art in light of the foregoing description. Accordingly, this description is intended to embrace all such alternatives, modifications and variations as fall within its spirit and scope.

Certain features that are described in this specification in the context of separate examples can also be implemented in combination in a single embodiment. Conversely, various features that are described in the context of a single embodiment can also be implemented in combination in multiple examples separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

Moreover, the separation of various system components in the examples described above should not be understood as requiring such separation in all examples, and it should be understood that the described components and systems can generally be integrated together in a single product or packaged into multiple products.

Thus, particular examples of the subject matter have been described. Other examples are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Nevertheless, it will be understood that various modifications may be made without departing from the spirit and scope of the claimed invention. While the invention has been described in conjunction with specific examples, it is evident that many alternatives, modifications and variations will be apparent to those skilled in the art in light of the foregoing description. Accordingly, this description is intended to embrace all such alternatives, modifications and variations as fall within its spirit and scope. Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

What is claimed is:

1. A method for processing a product; the method comprising:
    configuring a fabricator, wherein the fabricator is an apparatus comprising its own clean environment, and an automation to move a first product in a first vertically deployed primary cleanspace, between processing tools residing at least in part within the fabricator, and wherein the fabricator is not a processing tool residing within a clean room, the fabricator comprising:
        at least the first vertically deployed primary cleanspace, wherein the first vertically deployed primary cleanspace is not the cleanroom but the space within the fabricator which is cleaned by filtered air, wherein the filtered air is directed to flow in a horizontally unidirectional manner from a first vertical wall to a second vertical wall,
        at least a first tool chassis, said first tool chassis comprising:
            a chassis plate comprising a mating surface for receiving a toolpod containing a processing tool, and a base plate for positioning the chassis plate in an extended position and a closed position,
            wherein when the toolpod is mated to the chassis plate and the chassis plate is in the closed position, a tool port of the toolpod penetrates through the first vertical wall, is sealed with respect to the first vertical wall and is positioned within the first vertically deployed primary cleanspace and a tool body of the processing tool is exterior to the vertically deployed primary cleanspace; and
            wherein when the toolpod is mated to the chassis plate and the chassis plate assumes the extended position, the tool port is removed from the vertically deployed primary cleanspace without requiring removal of an adjacent processing too;
        at least a first toolpod attached to the first tool chassis, wherein the first toolpod surrounds and contains a first processing tool;
        a data processor performing at least a first cognitive computing algorithm,
        wherein the first cognitive computing algorithm comprises one or more of decision processing, sensitivity analysis, and rule determination,
        wherein the data processor provides control data to the first toolpod, wherein the control data is used in a control of a first process performed within the first toolpod, and wherein the control data is calculated at least in part by the performing of the first cognitive computing algorithm;
    processing the first product in the first toolpod with the first process controlled using the control data; and
    handling the first product at the tool port of the first toolpod within the first vertically deployed primary cleanspace.

2. The method of claim 1 wherein the first product comprises a substrate.

3. The method of claim 2 wherein the substrate is a wafer.

4. The method of claim 3 wherein the wafer is at least partially comprised of a semiconductor.

5. The method of claim 2 wherein the first product additionally comprises a material contained in the substrate, wherein the substrate comprises a cavity to contain a fluid.

6. The method of claim 5 wherein the material comprises a pharmaceutical.

7. The method of claim 1 wherein the first toolpod comprises a UV light source to create a sterile, antiseptic or anti-biologic aspect.

8. The method of claim 1 further comprising one or more of a belt driven automation or a roll to roll processing automation, wherein the one or more of the belt driven automation or the roll to roll processing automation interact with the tool port of the first toolpod.

9. The method of claim 8 wherein the tool port transfers a substrate with a cavity to contain a fluid to the one or more of the belt driven automation or the roll to roll processing automation.

10. The method of claim 1 wherein the data processor comprises neuromorphic parallel processors.

11. The method of claim 1 wherein the data processor comprises cognitive synaptic computing circuits.

12. The method of claim 1 wherein the data processor comprises electronic circuits modelled on biological neurons.

* * * * *